United States Patent [19]

Kilk et al.

[11] Patent Number: 4,890,236

[45] Date of Patent: Dec. 26, 1989

[54] METHOD AND APPARATUS FOR AIDING MANUAL INSTRUMENT SETTINGS BY DISPLAYING ESTIMATES OF FUTURE MEASUREMENT RESULTS

[75] Inventors: Erik Kilk, Rohnert Park; David A. Smith; Alan W. Schmidt, both of Santa Rosa, all of Calif.

[73] Assignee: Hewlett-Packard Company, Palo Alto, Calif.

[21] Appl. No.: 176,472

[22] Filed: Apr. 1, 1988

[51] Int. Cl.⁴ .............................................. G01R 23/00
[52] U.S. Cl. .................................. 364/485; 324/77 B; 340/789
[58] Field of Search .................... 364/485; 324/121 R, 324/77 B

[56] References Cited

U.S. PATENT DOCUMENTS

| | | | |
|---|---|---|---|
| 4,476,462 | 10/1984 | Feldman | 340/789 X |
| 4,652,816 | 3/1987 | Crookshanks | 324/77 B X |
| 4,764,915 | 8/1988 | Efron et al. | 364/485 X |

*Primary Examiner*—Emanuel S. Kemeny
*Attorney, Agent, or Firm*—William C. Milks, III

[57] ABSTRACT

Upon the adjustment of a control setting of a test instrument, the current data (taken before the change is effected) is manipulated by recalculating the trace data in light of any adjustment that is entered by a user. This represents an estimate of the effect of the adjustment in the control setting, and this estimate is redrawn on a display device. This modified image is preferably displayed before the real new image is ready to be displayed. This provides immediate feedback to the user so that adjustments can be effected without slowing the measurement process. Various embodiments provide panning or repositioning the trace left and right while changing the x-axis center frequency; stretching or compressing the trace (spanning) while changing the frequency span; or using a combination for adjustments to only the start or stop frequency. In one embodiment, the estimate can be displayed only after the user has committed to having a new measurement performed. Alternatively, in another embodiment, estimates can be displayed continuously while the user is making adjustments and before the user has committed to performing a new measurement. Having a test instrument display to the user an estimate of a future measurement while adjusting the control settings of the instrument in order to aid knob and button settings facilitates making adjustments visually during measurements which take longer than a fraction of a second. By having an immediate response on the display device, the user is not required to make blind changes.

20 Claims, 11 Drawing Sheets

USER INTERFACE TRACE ESTIMATING
IN RELATION TO A SPECTRUM ANALYZER

USER INTERFACE TRACE ESTIMATING IN RELATION TO A SPECTRUM ANALYZER

USER INTERFACE TRACE ESTIMATING (PANNING)

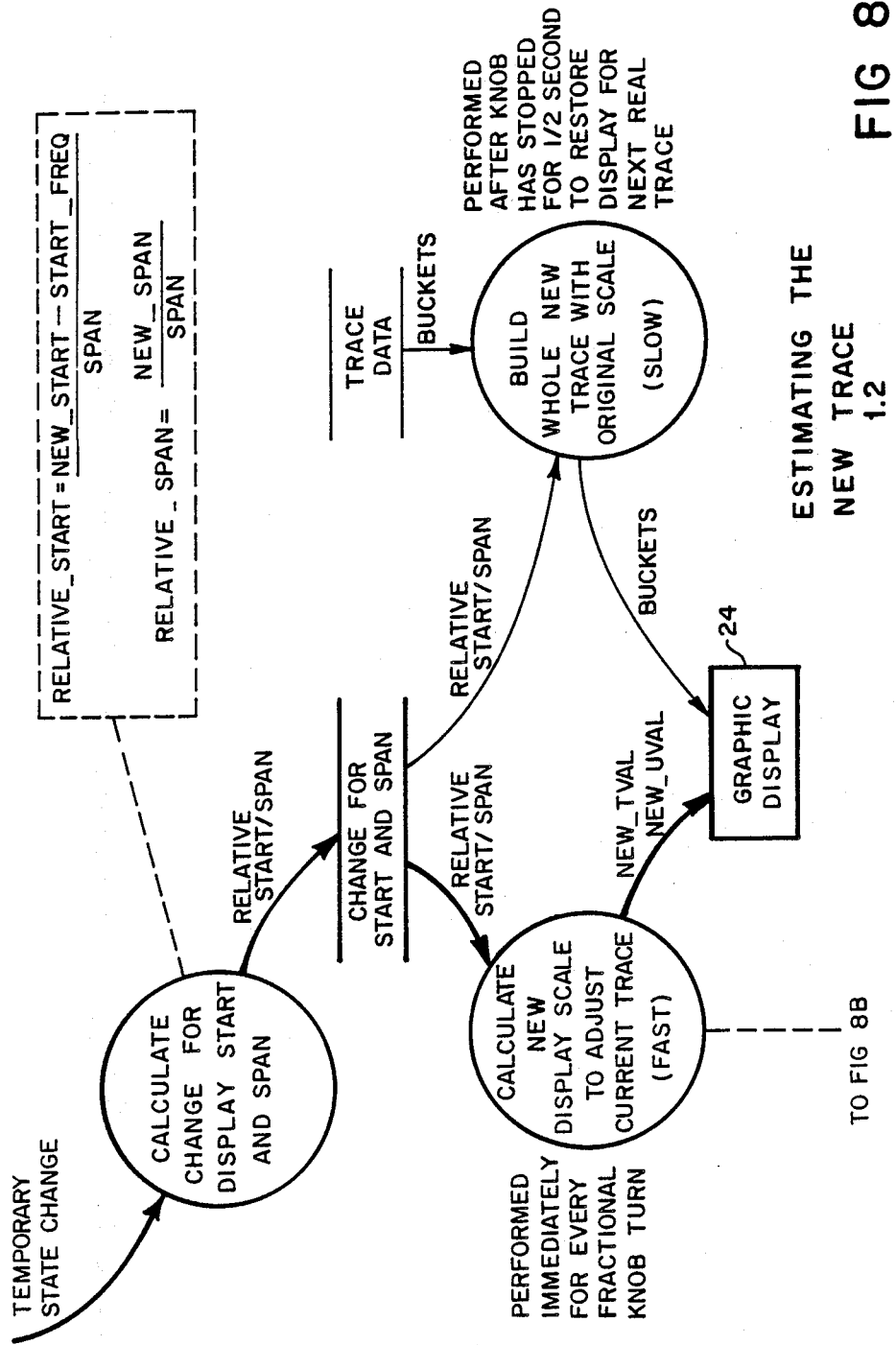

FROM FIG 8A

LENGTH = UVAL − TVAL
OFFSET = LENGTH * REL_START
NEW_TVAL = TVAL + OFFSET
NEW_UVAL = TVAL + OFFSET + (LENGTH * REL_SPAN)

IF REL_START > 0
   CLIP_LEFT = OFFSET
REL_SUM = REL_START + REL_SPAN
IF (REL_SUM < 1.0)
   CLIP_RIGHT = LENGTH(1−REL_SUM)

FIG 8B

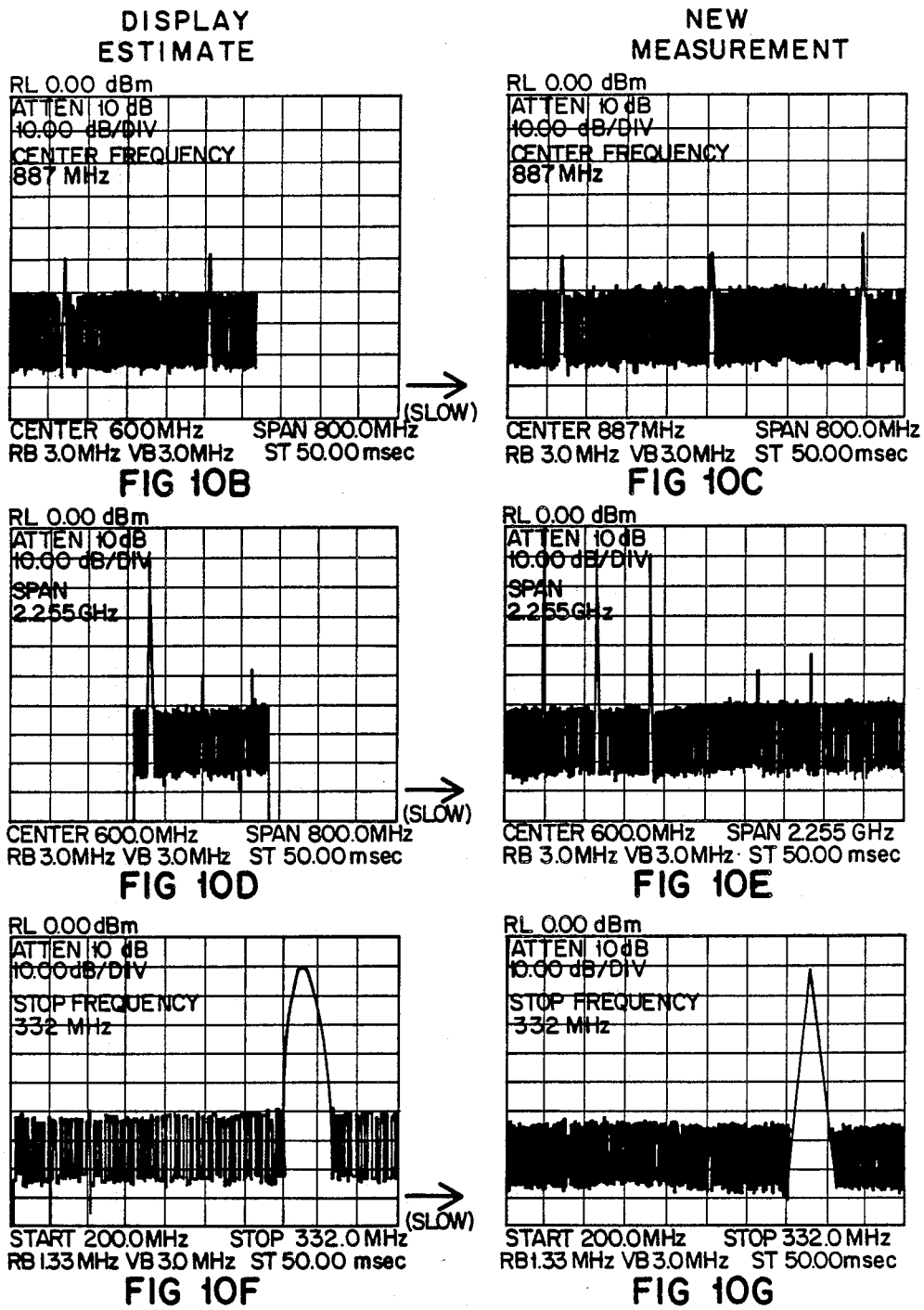

METHOD AND APPARATUS FOR AIDING MANUAL INSTRUMENT SETTINGS BY DISPLAYING ESTIMATES OF FUTURE MEASUREMENT RESULTS

BACKGROUND OF THE INVENTION

This invention relates to high-frequency electrical test instruments and, more particularly, to test instrumentation operable over a wide range of frequencies of interest. Specifically, the invention is directed to adjustment of manual control settings used in broadband test instruments and provides, in one embodiment, a radio-frequency (RF) and microwave spectrum analyzer whose frequency measurement settings for displaying measured data can be adjusted and in which previously measured data can be recast based on the adjustments and displayed as a precursor or estimate prior to or while a new measurement is being performed, thereby improving user efficiency and enhancing overall measurement throughput.

Signal analysis, simply defined, is the extraction of information from an electromagnetic signal, whether performed in the frequency or time domain. The most common time domain signal analyzer is the oscilloscope. In the frequency domain, the signal analyzer is the network analyzer or spectrum analyzer. These analyzers typically display the raw, unprocessed signal information, that is, voltage, power, period, waveshape, sidebands, and frequency.

By way of example, the spectrum analyzer is widely accepted as a general purpose test instrument capable of performing a broad range of measurements in the frequency domain. Examples of such spectrum analyzers are the HP8568 and HP8566 spectrum analyzers and HP71000A Modular Spectrum Analyzer available from Hewlett-Packard Company, Signal Analysis Division, Rohnert Park, Calif.

One technique to perform frequency domain measurements with a spectrum analyzer is known as the swept-tuned technique. The swept-tuned frequency spectrum analyzer can be either a tuned filter or a heterodyned receiver. Swept spectrum analyzers are used to measure a variety of characteristics of signals. There are many measurements which can be performed with a spectrum analyzer in response to a transmitted or received signal, where measurement of frequency, power, distortion, gain, and noise characterize a transmitter or receiver system.

FIG. 1 shows a generalized superheterodyne swept-tuned spectrum analyzer. An incoming signal mixes with a local oscillator (LO) signal, and when a mixing product equals the intermediate frequency (IF), this signal passes through to a peak detector. The peak detector output is amplified to cause a vertical deflection on a CRT display. The synchronism between the horizontal frequency axis of the CRT display and the turning of the local oscillator is provided by a sweep generator which both drives the horizontal CRT deflection and tunes the LO.

Test instruments with graphic display, such as oscilloscopes, network analyzers, and spectrum analyzers, typically have user controls to adjust the parameters of the measurement being taken. The graphic display provides the result of the last measurement taken. When the user adjusts a control setting by means of a knob or button, a new measurement is taken and the graphic display is updated to reflect the new measured data.

In the case of a swept spectrum analyzer, a consideration in narrowing resolution bandwidths for better resolution is the time required to sweep through the filters. Since these filters are bandwidth limited, they require a finite time to respond fully. How much time they are given depends upon how far and how fast the spectrum analyzer is tuned, that is, the effective rate of the analyzer is a function of frequency span and sweep time. For a given frequency span, the sweep time is inversely proportional to the square of the IF bandwidth (or the product of the IF and video bandwidths). Many spectrum analyzers have the capability of setting the sweep time automatically based on the span and bandwidth settings.

The sweep rate is typically variable, and can require considerable time, for example, a minute, to perform a swept measurement. However, changes in control settings are restricted to periods between measurements. For example, in the HP71000A Modular Spectrum Analyzer, requesting a change of the center frequency of the displayed spectrum has previously resulted in a delay for the analyzer to retune and perform another data sweep before displayed data is affected by the adjustment of center frequency.

Considered in more detail, FIG. 2 illustrates the traditional method of how present signal analyzers respond to adjustments to measured data. For example, when a control setting of a swept spectrum analyzer is changed, the feedback on the graphic display is delayed until the signal is swept again. Currently available spectrum analyzers either do not address the problem, or they restart the sweep to reduce the delay. It would be highly desirable to enable adjustments in control settings prior to or during a subsequent measurement (sweep) after data from an initial measurement is observed by the user.

SUMMARY OF THE INVENTION

One embodiment of the present invention provides a method and apparatus for trace panning and spanning or repositioning based on previously measured data. Since human interfaces to computers can respond quickly to provide a user feedback on how an adjustment in a control setting is affecting a measurement, it is helpful to have a test instrument update the display device quickly, even if it is just an approximation. This allows better hand-eye coordination in making adjustments to the control settings of test instruments and allows immediate feedback to the display device independent of analyzer sweep time to speed the measurement process.

In accordance with the invention, upon the adjustment of a control setting, the current data (taken before the change is effected) is manipulated by recalculating the trace data in light of any adjustment that is entered by the user. This represents an estimate of the effect of the adjustment in the control setting, and this estimate is redrawn on the display device. This provides immediate feedback to the user so that adjustments can be effected without slowing the measurement process.

To reduce the time between the user adjusting a measurement parameter and receiving a visual response to the adjustment, an old image is modified to reflect an approximation of how a new measurement will appear in light of the change. This modified image is preferably displayed before the real new image is ready to be displayed.

When making measurement changes which will alter the display in such a way that some of the same area previously measured will be viewed again, for example, an adjustment which will move the image on the screen, as opposed to having a completely new image drawn, the change is calculated using old measured data to provide an approximation or prediction of how new measured data will appear.

User feedback is improved by panning or repositioning the last trace data immediately to the left or right after the user request to give a very quick approximation where the new data will appear. This is followed by the typical retune, data sweep, and display of a new trace.

Various embodiments in accordance with the invention provide panning or repositioning the trace left and right while changing the x-axis center frequency; stretching or compressing the trace (spanning) while changing the frequency span; or using a combination for adjustments to only the start or stop frequency. For example, if a new center frequency is within the currently displayed span, the image can be panned or repositioned by:

$$\frac{\text{current\_center\_freq} - \text{new\_center\_freq}}{\text{span}} \times \text{num\_buckets}$$

pixels.

The general concept is to be displaying an approximation of a future measurement while the user is changing measurement settings. The time needed to calculate the approximation is typically quicker than taking a real measurement. In one embodiment, the estimate can be displayed only after the user has committed to having a new measurement performed. Alternatively, in another embodiment, estimates can be displayed continuously while the user is making adjustments and before the user has committed to performing a new measurement.

Having a test instrument display to the user an estimate of a future measurement while adjusting the control settings of the instrument in order to aid knob and button settings facilitates making adjustments visually during measurements which take longer than a fraction of a second. Often a spectrum analyzer takes many seconds to complete a sweep. By having an immediate response on the display device, the user is not required to make blind changes.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings. In the drawings:

FIG. 8 is a data flow diagram which illustrates calculation of revised trace data in light of adjustment of control settings, as generally shown in FIG. 6;

FIG. 9, comprising FIGS. 10A to 10G show estimates displayed in accordance with the method of the invention.

DETAILED DESCRIPTION OF THE PREFERRED EMBODIMENTS

By way of example, the invention will be described in connection with a superheterodyne swept-tuned spectrum analyzer, because such an analyzer provides wide input frequency coverage while permitting signal processing to be performed at a single intermediate frequency (IF).

Figure 3:
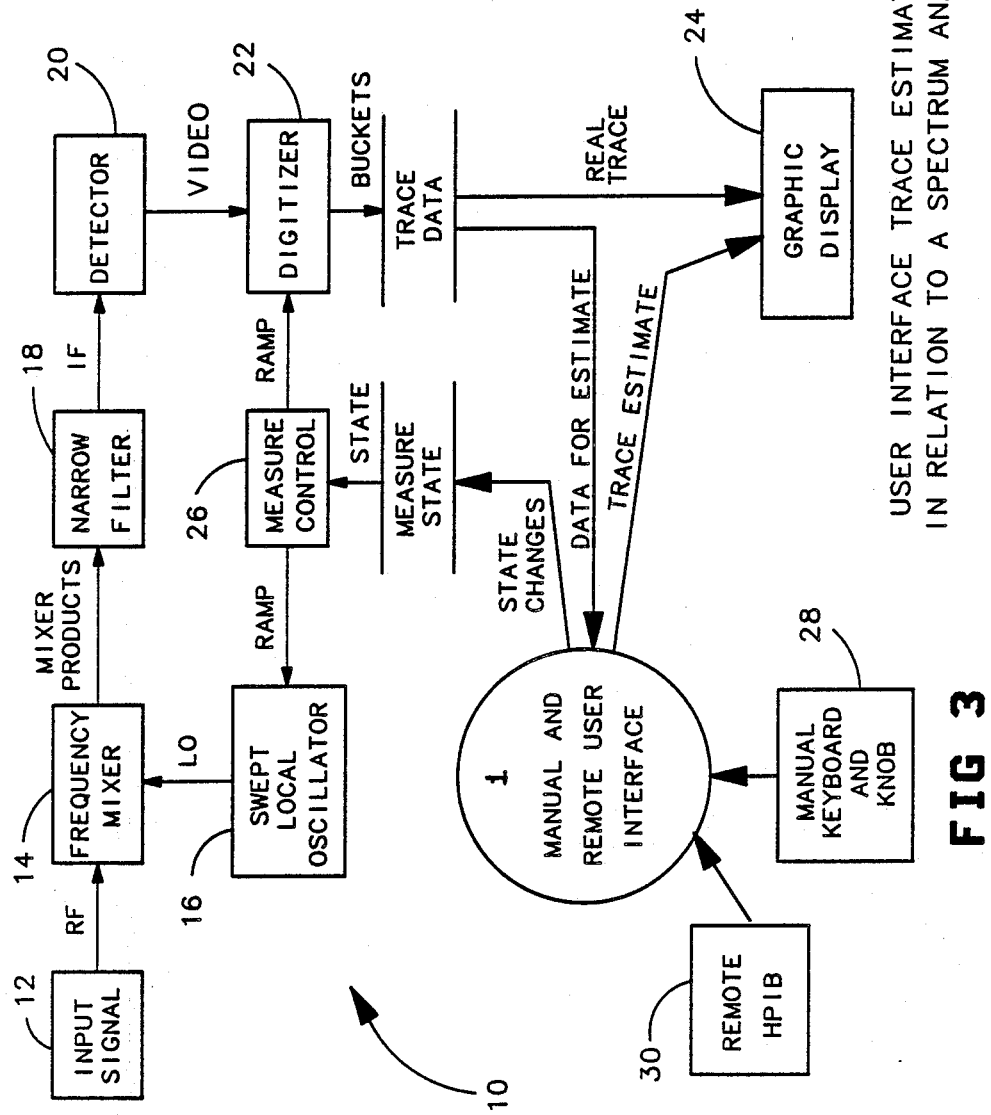
FIG. 3 is a block diagram of a swept-tuned spectrum analyzer in accordance with one embodiment of the invention.

FIG. 3 shows a superheterodyne swept-tuned spectrum analyzer, generally indicated by the numeral 10, in accordance with the invention, which incorporates adjustment of control settings and display of revised trace data in light of the adjustments as a precursor to future measurements. An incoming signal appears at an RF input 12. This signal mixes in a frequency mixer 14 with a signal produced by a swept local oscillator (LO) 16.

When a mixing product equals a predetermined IF, this signal passes through an IF filter 18 to a peak detector 20. The peak detector output is fed to a digitizer 22 which samples and stores the detected input signal data. This trace data can be amplified to cause a vertical deflection on a graphic display device or CRT display 24.

The synchronism between the horizontal frequency axis of the display device 24 and the tuning of the local oscillator 16 is provided by a sweep generator incorporated in a measure control circuit 26, which both drives the horizontal deflection of the display device 24 and tunes the local oscillator.

In accordance with the invention, the analyzer 10 displays an approximation of a future measurement while the user is adjusting control settings by turning a knob or depressing a button 28 incorporated into the analyzer. This yields a test instrument which provides the user an estimate of a new measurement in order to aid knob or button control settings. Such control settings can also preferably be remotely adjusted via an interface 30.

Figure 1:
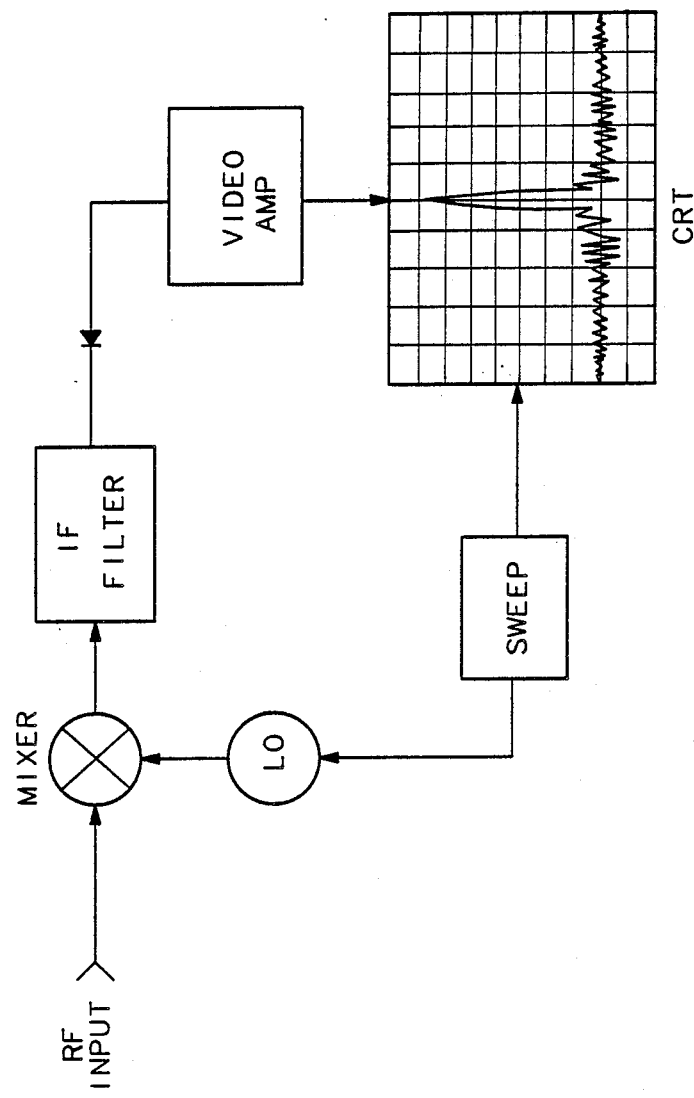
FIG. 1 is a block diagram of a conventional swept-tuned spectrum analyzer.
Figure 2:
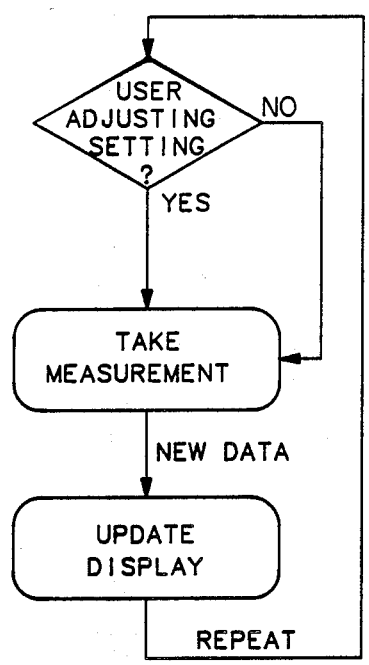
FIG. 2 is a flow chart of a traditional technique for adjusting control settings of the spectrum analyzer shown in FIG. 1.
Figure 4:
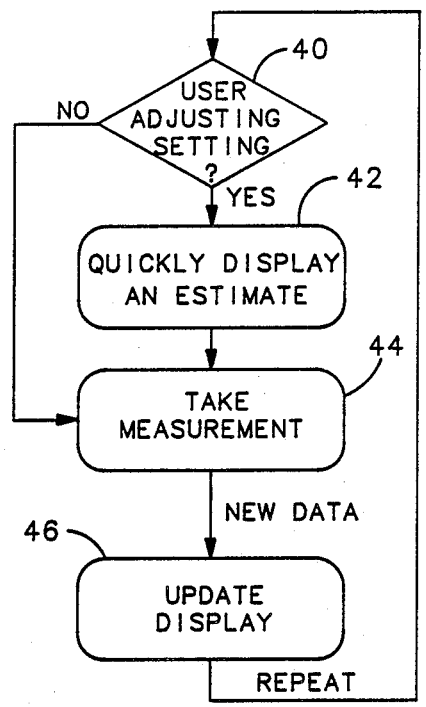
FIG. 4 is a flow chart on one embodiment of a method in accordance with the invention for displaying a quick estimate in light of an adjustment of a control setting before taking a time consuming measurement.

One embodiment of the method for facilitating adjustment of control settings of a test instrument in accordance with the invention is diagrammed by the flow chart shown in FIG. 4. FIG. 4 shows the addition of displaying a quick estimate before performing a time consuming measurement. In the case of the method for facilitating adjustment of control settings shown in FIG. 4, generally, an estimate is displayed only after the user commits to having a new measurement performed.

Considered in more detail, as shown in FIG. 4, the analyzer 10 determines whether or not the user is adjusting control settings by means of the knob or button 28, as indicated by the numeral 40. If the user adjusts a control setting, as determined by the step 40, the analyzer 10 calculates how measured data might appear based on the new control settings and previously measured data, and the result is displayed as an estimate on the display device 24, as indicated by the numeral 42. After the estimate is displayed, as indicated by the step 42, or if no adjustment is made, as determined by the step 40, a new measurement is performed by the analyzer 10, as indicated by the numeral 44. The newly measured data is then displayed on the display device 24 with the display updated to incorporate any adjustments in the control settings, as indicated by the numeral 46. This process is then repeated for each subsequent measurement.

Figure 5:
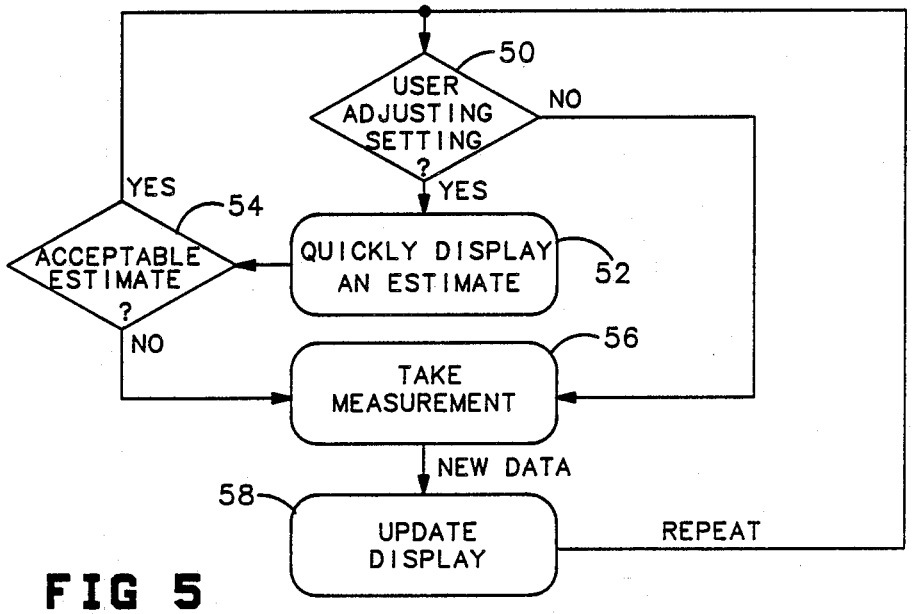
FIG. 5 is a flow chart of a modified embodiment of the method in accordance with the invention for holding up a new measurement until either the user has stopped adjusting parameters or an acceptable estimate cannot be accomplished from the last measured data.

A modified embodiment of the method for facilitating adjustment of control settings of a test instrument in accordance with the invention is diagrammed by the flow chart shown in FIG. 5. FIG. 5 shows holding up the measurement until either the user has stopped changing parameters or an acceptable estimate cannot be accomplished from the last measured data. In the case of the modified method for facilitating adjustment of control settings shown in FIG. 5, generally, an estimate is continuously displayed while the user is making adjustments and before the user has committed to performing a new measurement.

Considered in more detail, as shown in FIG. 5, the analyzer 10 initially determines whether or not the user is adjusting control settings by means of the knob or button 28, as indicated by the numeral 50. If the user adjusts a control setting, as determined by the step 50, the analyzer 10 calculates how measured data might appear based on the new control settings and previously measured data, and the result is displayed as an estimate on the display device 24, as indicated by the numeral 52. After the estimate is calculated, as indicated by the step 52, the analyzer 10 checks whether or not the adjustment produces a result within a predetermined range of previously measured data, as indicated by the numeral 54. For example, trace scaling can limit a sweep when the frequency span is less than 1/10 or greater than 10 times the magnitude of the change. If no adjustment is made, as determined by the step 50, or the estimate is not limited by previously measured data, as determined by the step 54, a new measurement is performed by the analyzer 10, as indicated by the numeral 56. If the estimate exceeds limits, as determined by the step 54, a new measurement is performed by the analyzer 10, as indicated by the step 56. The newly measured data is then displayed on the display device 24 with the display updated to incorporate any adjustments in the control settings, as indicated by the numeral 58. This process is then repeated for each subsequent measurement.

Various approximations can be performed. Examples are panning the trace left and right while changing the x-axis center frequency; stretching or compressing the trace (spanning) while changing the frequency span; or using a combination for adjustments to only the start or stop frequency.

For example, adjustments can be made to the center frequency of the display device 24. The general technique is:
(1) If the new requested center frequency is already being displayed somewhere on the display, in other words, is within the current frequency span, then proceed with trace panning since some old measured data, namely, the last trace, is available to estimate the appearance of the future measurement.
(2) Calculate how much to reposition the image horizontally by calculating:

$$\frac{current\_center\_freq - new\_center\_freq}{frequency\_span}$$

to yield the fraction of the display screen to move.
(3) Multiply the above fraction by a constant (numbuckets) related to the number of available display points to translate the change into screen coordinates.
(4) Display the old image offset by the above result.

This calculation is executed between detection of a change in the center frequency parameter of the analyzer 10 and the time when the new measurement is ready to be displayed.

Figure 6:
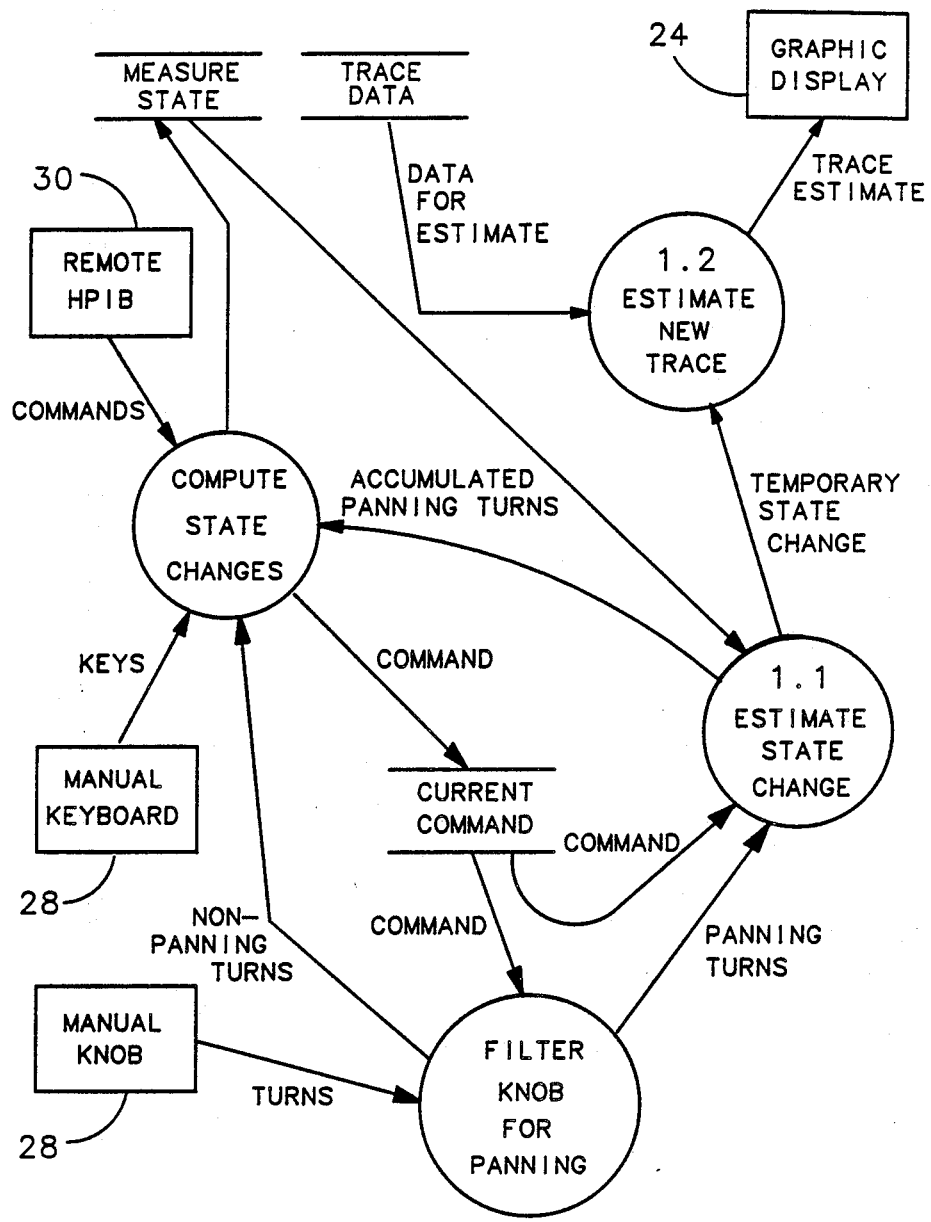
FIG. 6 is a data flow diagram of the operation of the user interface shown in FIG. 3 and illustrates display of estimates in response to adjustment of control settings.
Figure 7:
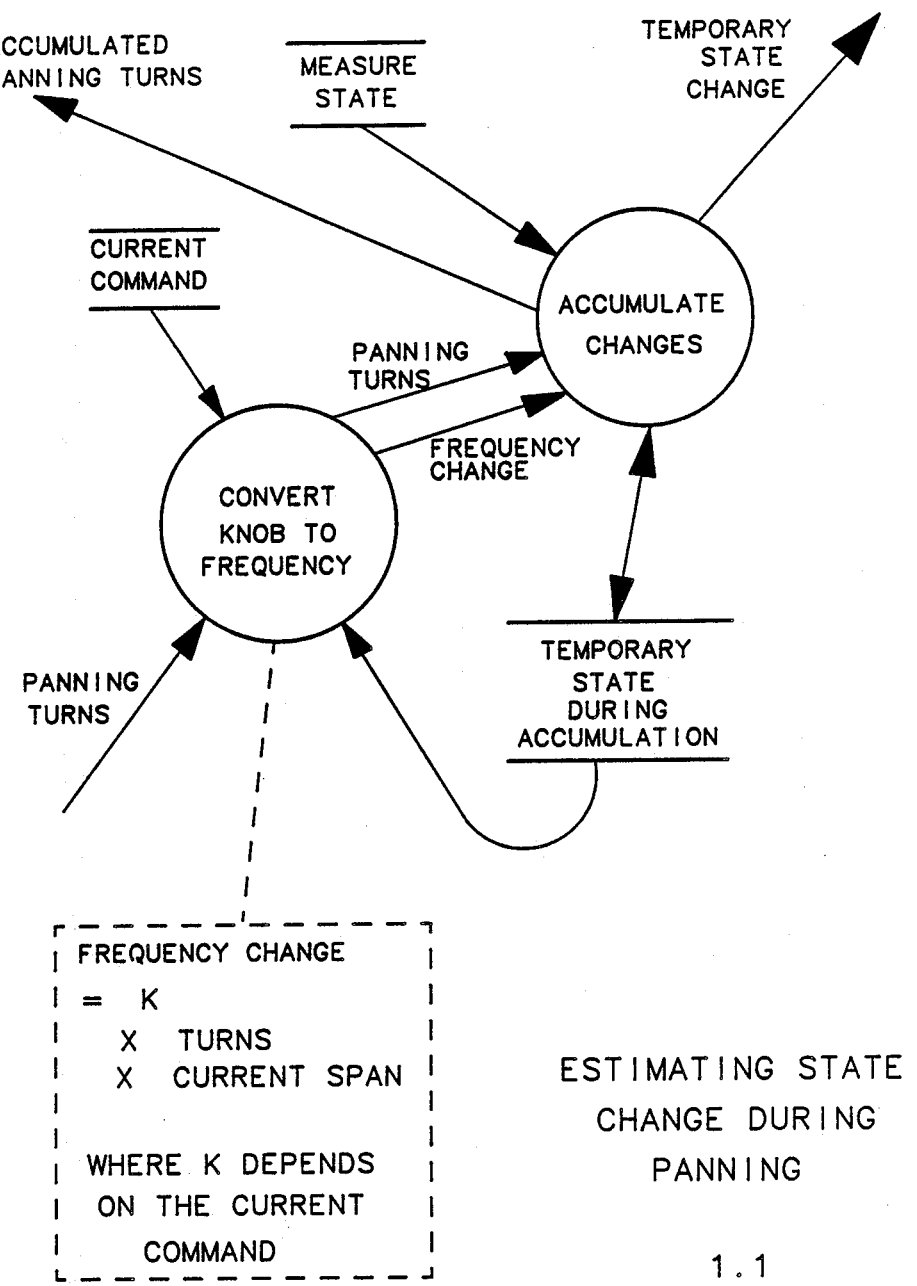
FIG. 7 is a data flow diagram which illustrates detection of adjustment of control settings, as generally shown in FIG. 6.

The lower portion of FIG. 3 and FIGS. 6–8 are drawn in accordance with a technique known as data flow diagramming. FIG. 3 is the highest level drawing. This level shows all external input/output. The "bubble" labelled "1" in FIG. 3 is shown "exploded" in FIG. 6. Similarly, the bubbles labelled "1.1" and "1.2" in FIG. 6 are shown exploded in FIGS. 7 and 8, respectively. These data flow diagrams illustrate operation of the analyzer 10 to provide estimates of future measurements based on old measured data in response to adjustments of control settings.

The firmware which controls the HP71000A Modular Spectrum Analyzer can be modified to incorporate panning and spanning to aid user adjustments of test instrument control settings. While making measurement adjustments, the user is presented with an approximation of how the new measurement results will appear. This is accomplished quickly enough to provide the user immediate and reliable feedback on the adjustments.

The HP71000A Modular Spectrum Analyzer includes a graphical display, such as an HP70205A Graphic Display, that displays frequency on the horizontal axis and power on the vertical axis. This display includes a command to pan any displayed item along the x-axis. The display language particulars, along with the techniques previously used to send trace data from the HP71000A Modular Spectrum Analyzer to this display, requires synchronization of the pen placement to avoid spurious marks on the screen, as will be described in more detail later.

For example, one implementation of the HP71000A Modular Spectrum Analyzer involves adjustments to the center frequency of the display. The earlier this is accomplished, the better the feedback to the user. For convenience, in the HP71000A Modular Spectrum Analyzer, this is performed as the first part of a setcf subroutine. This subroutine performs other functions, such as calculating and setting a new start frequency for the sweep, recording the change, and updating the digital readouts on the display.

Figure 9A:
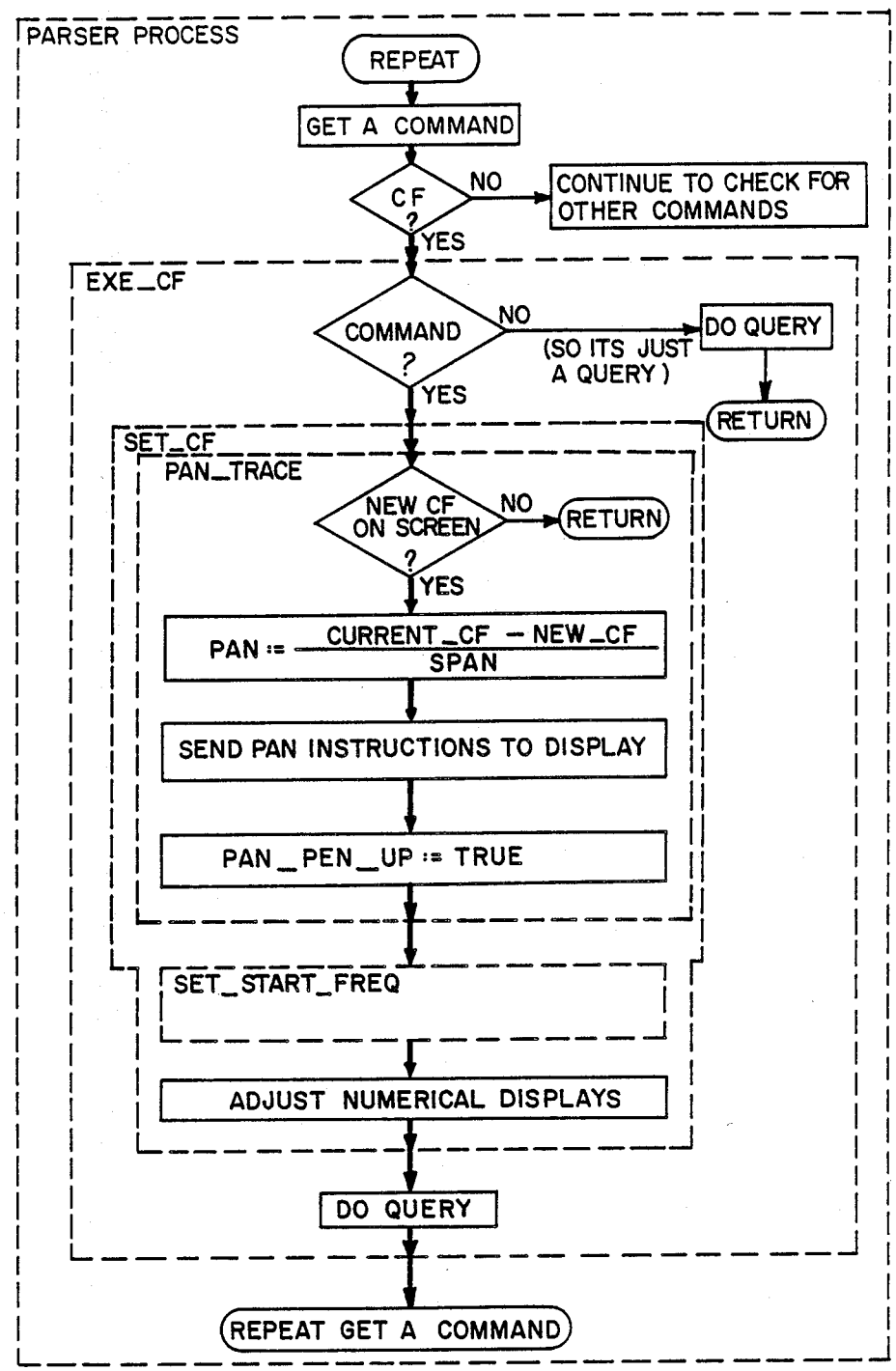
FIGS. 9A and 9B, is a detailed flow chart of providing an estimate in light of adjustment of the center frequency control setting.
Figure 9B:
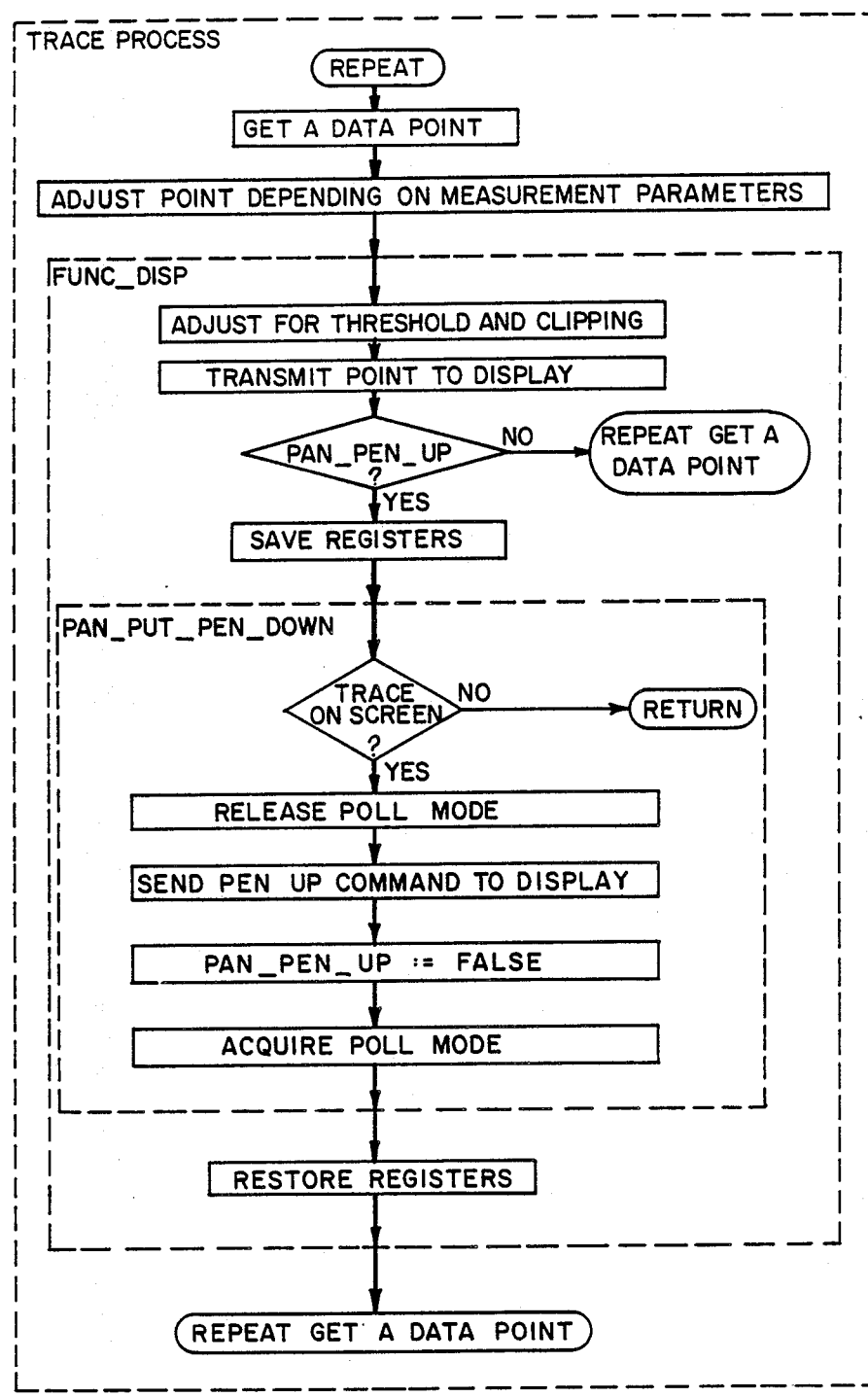

The detailed flow chart shown in FIG. 9 illustrates panning and spanning in terms of the source code specific to the HP7100A Modular Spectrum Analyzer. The firmware controlling the HP71000A Modular Spectrum Analyzer is written in HP Pascal and Motorola 68000 Assembly Language. The Pascal source is compiled (translated) into Motorola 68000 Assembly Language.

Several processes share a single 68000 processor by being switched in and out of control during various operations of the analyzer. Important for the implementation of trace panning and spanning are two parsing processes, manual and remote, and a trace process. The parsing processes handle execution of commands, and the trace process handles processing trace data and displaying this data on the display.

The parsing processes execute the subroutine setcf when the center frequency of the analyzer is adjusted. Adjusting the center frequency changes the measurement to analyze a different portion of the frequency spectrum, thus changing what is displayed. If the change on the screen is small enough to appear to accommodate repositioning, then trace panning is enabled.

The set center frequency panning subroutine (setcf) is called, for example, by an execcf routine. The code executed when the user requests a center frequency adjustment in the case of the method for facilitating adjustment of control settings shown in FIG. 4 is as follows. The setcf subroutine is coded in Pascal as:

```
1.   PROCEDURE set_cf( new_cf : longreal ) ;
2.   VAR
3.       stop_freq : longreal ;
4.   BEGIN
5.       WITH state DO BEGIN
             {First! Pan the old trace.}
6.           pan_trace (new_cf);
             {Next! Adjust the measurement.}
7.           set_start_freq( new_cf - span * half ) ;
             {End by updating numerical annotations on the
             screen.}
8.           new_cf := start_freq + span * half ;
9.           IF disp_act_cmd = cmd_cf THEN
10.          display_active_value( 2, new_cf + frq_offset,
                 hz_unit,
11.              freq_resolution( dev_crt )) ;
12.          IF frq_ann_mode = cf_span THEN
13.          disp_curr_val (ann_freq1, new_cf + frq_offset,
14.              freq_resolution( dev_crt ), hz_unit )
15.          ELSE
16.          show_freq_parm ;
17.          END ;
18.      data_invalid ;
19.  END;
```

The pantrace subroutine calculates whether or not the current trace on the display screen can be panned or repositioned to bring it in line with the new center frequency request. If so, it then calculates how much the trace must be relocated and instructs the display to do the panning.

The HP70205A Graphic Display draws lines by connecting points. This display draws a line from the previous point to the current point. When drawing traces, amplitude values are sent, and the display supplies the correct horizontal coordinate and connects a line from the previous amplitude value to the current amplitude value. If a trace is panned such that the next amplitude point sent to the display now follows a point which previously was off the display screen, a line is drawn from amplitude zero to the new amplitude. This causes an unwanted "glitch" in the display.

The unwanted glitch is removed by raising the pen off the display screen until after the first amplitude point is plotted following a pan. This removes the glitch. Unfortunately, the next point is also not drawn. But, the pen is set down on the display screen, and a line is drawn from this previous "undrawn" point to the new point. Since this line comes from the undrawn point, it is insignificant that the point itself is not visible.

This glitch removal requires communication between the parsing processes and the trace process. The trace process is informed that the pen is up so that it can put the pen back down after a point is sent. A global boolean variable, panpenup, is used to inform the trace process that a pan has taken place so it can handle the pen correctly.

Accordingly, the code to process and display new trace data is modified so that the following happens after the current trace is panned: (1) graphics pen goes up; (2) next real data point is plotted; (3) graphics pen goes down; and (4) the remainder of the new trace is plotted. The pantrace subroutine is coded in Pascal as:

(Pan the trace immediately to give rough visual indication before a new trace is displayed.)

```
1.   PROCEDURE pan_trace( new_cf : longreal );
2.   VAR
3.       current_cf : longreal;
4.       pan: integer;
5.       panstr: PACKED ARRAY[0..79] OF char;
6.   BEGIN
         {Make sure a trace is on the screen and display is
         ready.}
7.   IF trace_on_screen AND trace_disp_ready THEN BEGIN
8.       WITH state DO BEGIN
             {Make sure new center frequency is already on
             screen.}
9.       IF (new_cf>start_freq) AND (new_cf < start_freq +
             span) THEN BEGIN
             {Calculate how much to scoot the trace of the old
             display.}
10.      current_cf := start_freq + span * half;
11.      pan := ROUND (((current_cf - new_cf) / span) *
             num_buckets);
             {Form the command to instruct the display device to
             scoot the current image the current amount.}
             {Form the commands to indicate which image on the
             screen we want panned.}
12.      group_item_string (trace_group, active_trace+1,
             panstr);
             {Form 'PN' to say we want to pan an image.}
13.      concat_str (panstr, 'PN');
             {Form the distance to pan.}
14.      integer_string (pan, 5, ADDR(panstr));
             {To keep the display clean when the next real
             trace point is drawn, we must temporarily stop any
             drawing until after the next point is sent to the
             display. If we don't do this, the next point
             drawn will have a line drawn to it from the wrong
             place on the display.}
15.      concat_str (panstr, ';PU;');
             {Wait for other processes to not be using the
             display, and prevent other processes from using
             it.}
16.      acquire_display;
             {Send the command to scoot the trace.}
17.      out_disp_string (status_path, panstr);
             {We raised the pen to keep any drawing from
             occurring on the next point specified. We record
             that we did this so that the trace process can put
             the pen down after it sends one point.}
18.      pan_pen_up := true;
             {This display is now released for other processes
             to use when they need it.}
19.          release_display;
20.      END; {if new_cf > start_freq...}
21.          END; {with}
22.  END; {trace_on_screen}
23.  END; {procedure}
```

Similarly, the code executed when the user requests panning the trace left and right while changing the x-axis center frequency; stretching or compressing the trace (spanning) while changing the frequency span; or using a combination for adjustments to only the start or stop frequency in the case of the modified method for facilitating adjustment of control settings shown in FIG. 5 is as follows.

```
"68000" PREPROCESS           compile
{ @(#)kbd.P 6.7 }    ,
$ BASE_PAGE $
$ WARN_OFF $
PROGRAM KBD_CONTROL_MODULE;

{ ***************************************************
  ***************************************************
                                                 
                                                 
         K E Y B O A R D    P R O C E S S        
                                                 
                                                 
  ***************************************************
  ***************************************************
                                                 
     AUTHORS : ERIK KILK                         
                                                 
     Date:  May, 1987  Rewrite for performance as 
     an independent process with new algorithms   
     (Erik).                                      
                                                 
  ***************************************************
  *************************************************** }

{ ***************************************************
     GLOBAL CONSTANTS, TYPES, AND VARIABLES FOUND IN
     INCLUDE FILES
  *************************************************** }

$ EXTENSIONS ON $

# INCLUDE /users/msa/pub/g_system.h
# INCLUDE /users/msa/pub/g_bits.h
# INCLUDE /users/msa/pub/g_opsys.h
# INCLUDE /users/msa/pub/g_os_misc.h
# INCLUDE /users/msa/pub/g_cn_misc.h
# INCLUDE /users/msa/pub/g_startup.h
# INCLUDE /users/msa/pub/g_keybord.h
# INCLUDE /users/msa/pub/g_command.h
# INCLUDE /users/msa/pub/g_state.h
# INCLUDE /users/msa/pub/g_io_path.h
# INCLUDE /users/msa/pub/g_io1.h
INCLUDE /users/msa/pub/g_stacks.h { ***************************************************
     LOCAL CONSTANTS
  *************************************************** }

$ BASE_PAGE $

CONST
```

```
NUM_MOV_GRAT = 3;              { number of moving graticles  }
MOV_GRAT_GP = 1;               { same as graticle, disp line,
                                 ref line                    }
MOV_GRAT_IT = 8;               { NOTE: Uses NUM_MOV_GRAT
                                 items from here             }
KBD_BUFLEN =      50;          { size raw data from GEM to
                                 kbd process                 }
MAN_BUFLEN =      30;          { size kbd process to man
                                 process fifo                }
KEY_PENDING = [b7] ;           { bits in GEM's status field  }
RPG_PENDING = [b2] ;
READY_BIT = [b4] ;
NO_KEY_PRESSED = 0040H;        { response to manual parser   }

{*** The RPG period is the time between the last two
     RPG counts.  An upper limit is placed on this to
     calculate the speed of the RPG.  If the max has been
     reached, we just assume the knob has been stopped
     for a long time.                                     ***}
MAX_RPG_PERIOD = 500000;    { 0.50 sec }

{*** When the RPG period is MAX_RPG_PERIOD, we don't
     have enough information to calculate the RPG speed
     since a count may not have arrived in a very long
     time.  In this case, we wait up to ACCEL_INTERVAL to
     see if there is another count in order to calculate
     the RPG speed.                                       ***}
ACCEL_INTERVAL =  40000;    { 0.04 sec }

{*** When the manual parser is finished, it is
     instructed to wait MAX_GEM_DELAY before proceeding
     in order to allow the trace processor to run (it has
     a very low priority) with the last command.          ***}
MAX_GEM_DELAY =  50000; { 0.05 sec }

{*** When a count comes in, we may want to know if
     the RPG is still turning so that we can decide on
     whether to give the counts to the manual parser.  To
     decide this, we wait until a count comes in or
     COULD_STILL_BE_TURNING has passed.                   ***}
COULD_STILL_BE_TURNING = 400000;{ .4   sec }

{*** While we are waiting COULD_STILL_BE_TURNING
     until a count comes in, we have to periodically
     check for a count.  We don't want to wait
     COULD_STILL_BE_TURNING if a count is already here.
     So we check every TURNING_CHECK_TIME.                ***}
  TURNING_CHECK_TIME =  20000;  { 20 msec }

{ ************************************************************
  LOCAL TYPES
  ************************************************************ }
```

```
TYPE
   kbd_status_type  = (rpgturn,keypress,gotolocal,gotoremote,
                       readybit);
   kbd_func_select  = (just_got_rpg, rpg_turning,
                       flushing_rpg, waiting_for_manual,
                       init_func, good_bye, waiting_for_turn);
   kbd_select_set   = SET OF kbd_func_select;

{ ************************************************************
   LOCAL VARIABLES
  ************************************************************ }

VAR                            { Local Variables }
   kbd_status       : SET OF kbd_status_type;
   kbd_fifo         : fifo;    { raw data from GEM to kbd
                                 process                     }
   kbd_buffer       : ARRAY [1..KBD_BUFLEN] OF byte;
   kbd_pcb          : pcb;
   manual_buffer    : ARRAY [1..MAN_BUFLEN] OF byte;
   rpg_time_last    : signed_32 ;{ Time at which the RPG was
                                   last read                 }
   time_sweep_ready : signed_32;
   sweep_ready      : flag ;
   end_packet       : cmd_packet;
   last_packet      : cmd_packet;{ last_packet read for
                                   look_ahead               }
   first_count      : integer;{ first rpg count for accel
                                calculation                 }
   accumulator      : integer;
   select_request   : kbd_select_set;
   keyboard_waiting : boolean;
   knob_could_be_turning:boolean;
   first_key        : boolean ;
   manual_waiting   : boolean;
   use_previous     : boolean;{ was last read a look_ahead  }
   packet_bucket    : cmd_packet;{ for tracing }
   last_pkd_type    : keyboard_data_type;
   last_pkd_data    : INTEGER;

{ ************************************************************
   GLOBAL VARIABLES
  ************************************************************ }

$ GLOBVAR ON           $         { Global Variables }

VAR
   manual_fifo      : fifo;    { kbd process to man process
                                 fifo                        }
   kbd_path         : integer;
   kbd_path_ready   : boolean;
   disp_ready       : flag ;
```

```
    rpg_accel              : boolean;{ accel on or off (off for
                                       dymo label mode)            }
    rpg_period             : signed_32 ;{ should get moved local
                                          when execl fixed          }
    kbd_function           : pointer;
    enable_kbd_function    : boolean;
    (gem_version           :          integer;}

$ GLOBVAR OFF          $

{ ************************************************************
  EXTERNAL VARIABLES - Include actual kbd functions as
  pointers
  ************************************************************ }

$ EXTVAR ON            $              { External Variables } abort_manual            : boolean;
    current_clear_on_key    : boolean;
    status_path             : integer;
    dots_per_line           : integer;
    we_suspended_trace      : boolean;
    hide_rem_ap             : boolean;

$ FAR                  $ key_stack              : ARRAY [0..key_stacksize] OF word;
    cf_kbd_function        : pointer; { these are really
                                        procedures }
    sp_kbd_function        : pointer;
    fa_kbd_function        : pointer;
    fb_kbd_function        : pointer;
    p1x,p2x,p1y,p2y        : integer;
    xmult, ymult           : longreal;

$ BASE_PAGE            $
$ EXTVAR OFF           $

{ ************************************************************
  EXTERNAL PROCEDURES FOUND IN INCLUDE FILES
  ************************************************************ }

$ LIB_ABS_SHORT   $
$ CALL_ABS_SHORT  $
# INCLUDE /users/msa/pub/p_os_flag.h
# INCLUDE /users/msa/pub/p_os_fifo.h
# INCLUDE /users/msa/pub/p_os_time.h
# INCLUDE /users/msa/pub/p_os_misc.h
# INCLUDE /users/msa/pub/p_util.h
$ CALL_ABS_LONG $
# INCLUDE /users/msa/pub/p_assem.h
# INCLUDE /users/msa/pub/p_mn_init.h
```

```
# INCLUDE /users/msa/pub/p_g_state.h
# INCLUDE /users/msa/pub/p_config1.h
# INCLUDE /users/msa/pub/p_io_1.h
# INCLUDE /users/msa/pub/p_io_2.h
# INCLUDE /users/msa/pub/p_io_3.h
# INCLUDE /users/msa/pub/p_derr.h
# INCLUDE /users/msa/pub/p_dfrm.h
# INCLUDE /users/msa/pub/p_dto.h
# INCLUDE /users/msa/pub/p_dacq.h
# INCLUDE /users/msa/pub/p_dmsg.h
# INCLUDE /users/msa/pub/p_dpth.h
INCLUDE /users/msa/pub/p_string.h { ***********************************************************
    MISC EXTERNAL PROCEDURES
  *********************************************************** }

PROCEDURE  update_menus_now;                          EXTERNAL;
    PROCEDURE  send_im (path : integer) ;                 EXTERNAL;
    PROCEDURE  path_off_accepted (path: integer;
               x : byte);                                 EXTERNAL;
    PROCEDURE  send_lang;                                 EXTERNAL;
    PROCEDURE  call_kbd_function (VAR d: integer;
               mw: boolean; s: kbd_func_select);          EXTERNAL;
    PROCEDURE  config_annun (p,g,i,x,y: integer;
               VAR s: string);                            EXTERNAL;
    PROCEDURE  group_item_string (g,i: integer;
               VAR s: string);                            EXTERNAL;
    PROCEDURE  update_dscale_nocalc;                      EXTERNAL;
    PROCEDURE  send_scale (path, x1, x2, y1, y2:
               integer);                                  EXTERNAL;
    PROCEDURE  write_the_message (main:string;VAR
               o:string; a,b: boolean);                   EXTERNAL;
    PROCEDURE  clear_any_holdoff;                         EXTERNAL;
    PROCEDURE  couple_on_empty (VAR input; fifo);         EXTERNAL;

$ CALL_PC_SHORT $
$ OPTIMIZE ON   $

{ ***********************************************************
    UPDATE THE LOCAL COPY OF THE GEM'S STATUS BYTE.
    CALLED ONLY BY READ_THE_KBD.
  *********************************************************** }

PROCEDURE update_kbd_status( packet : cmd_packet ) ;
BEGIN
    IF packet.command = status THEN BEGIN
       IF KEY_PENDING <= packet.bits THEN BEGIN
          kbd_status:= kbd_status + [keypress] ;
          first_key := true ;
    END ;
```

```
        IF READY_BIT <= packet.bits THEN kbd_status:= kbd_status +
                    [readybit] ;
        IF RPG_PENDING <= packet.bits THEN kbd_status :=
                     kbd_status + [rpgturn] ;
    END ELSE IF packet.command = switch_control THEN BEGIN
        IF packet.info = byte(loccs) THEN
            kbd_status := kbd_status + [gotolocal] - [gotoremote]
        ELSE
            kbd_status := kbd_status + [gotoremote] - [gotolocal] ;
    END;
END;

{ *************************************************************
    READ THE KEYBOARD FOR ALL ROUTINES
  ************************************************************* }

FUNCTION read_the_kbd (not_look_ahead: boolean;
                        VAR abort: boolean) : cmd_packet ;
VAR
    packet      : cmd_packet;
    filter      : boolean;
    got_any     : boolean;
BEGIN
    REPEAT
        filter := FALSE;

{  Get a packet, if previously looked ahead, then we
           already have it. }
        IF use_previous THEN BEGIN
            packet := last_packet;
            use_previous := FALSE;
            got_any := TRUE;
        END ELSE BEGIN {  Otherwise, if not looking ahead, wait for a word from
           GEM }

IF not_look_ahead THEN BEGIN
            keyboard_waiting := TRUE;
            get_fifo_word(kbd_fifo,word(packet));  { wait for SRQ
                                                    from GEM }
            keyboard_waiting := FALSE;
        END ELSE BEGIN
            got_any := extract_fifo_word (kbd_fifo, word(packet))
        END;
END;
$ OPTIMIZE OFF $ IF not_look_ahead THEN BEGIN
    CASE packet.command OF
        switch_control,
        status :           update_kbd_status( packet ) ;
```

```
           path_on:     BEGIN
                            hide_rem_ap := FALSE;
                            kbd_path_ready := TRUE;
                            cs_active_lights(kbd_path_ready);
                            IF NOT first_key THEN
                               update_menus_now;
                            acquire_display;
                            send_im (kbd_path) ;
                            send_lang ;
                            release_display;
                            clear_any_holdoff;
                        END;

path_off:    BEGIN
                            kbd_path_ready := FALSE;
                            cs_active_lights(kbd_path_ready);
                            IF packet.info <> 0 THEN
                               path_off_accepted(kbd_path,
                                   packet.info);
                            kbd_status:=[] ;
                            abort := TRUE ;
                        END;
          OTHERWISE   ;
       END { case }

END ELSE BEGIN      { look ahead }
      IF got_any THEN BEGIN  { look ahead with something there }
         last_packet  := packet;
                              { When looking ahead, filter out
                                msg_ends }
         filter       := packet.command = msg_end;
         use_previous := NOT filter;
   END ELSE BEGIN             { look ahead with nothing there }
      packet.command := fifo_cmd_type (0);
      packet.info    := 0;
      use_previous := false;
   END;
 END;
END;

$ OPTIMIZE ON $

UNTIL (abort) OR (kbd_path_ready AND (NOT filter));
packet_bucket := packet;
read_the_kbd := packet ;
END ;

{ ************************************************************
    GET A BYTE OF DATA FROM THE KEYBOARD
  ************************************************************ }

FUNCTION get_kbd_data (VAR abort:boolean) : byte ;
```

```
VAR
   packet     : cmd_packet;
   data_found : boolean ;

BEGIN
   data_found := false ;
   REPEAT
      packet := read_the_kbd (TRUE, abort) ;
      IF packet.command = data THEN
      BEGIN
         get_kbd_data := packet.info ;
         data_found := true ;
      END;
   UNTIL (data_found) OR (abort) ;
END ;

{ ************************************************************
   READ AN INTEGER (TWO BYTES) FROM THE KEYBOARD
  ************************************************************ }

FUNCTION get_kbd_int (VAR abort:boolean) : integer ;

VAR
   t : bits_16 ;
   packet    : cmd_packet;

BEGIN
   t.hgh_byte := get_kbd_data (abort) ;
   IF NOT abort THEN t.low_byte := get_kbd_data (abort);
   IF NOT abort THEN get_kbd_int := t.int ;
END ;

{ ************************************************************
   A MEASUREMENT CHANGE IS BEING MADE THAT AFFECTS THE
   TRACE DATA.  HOLD ALL GEM INPUT UNTIL A SHORT TIME
   AFTER THE SWEEP IS READY TO START.  NOTE:  PREVIOUSLY
   ONLY RPG COUNTS WERE HELD, THIS ALLOWED QUICK REPEATED
   STEP KEYS TO KEEP THE DISPLAY FROM BEING UPDATED.
  ************************************************************ }

$ GLOBPROC ON $

PROCEDURE kbd_hold_rpg ;
BEGIN
   clear_flag( sweep_ready ) ;
END ;

$ GLOBPROC OFF $

{ ************************************************************
   THE SWEEP IS STARTING AGAIN.  RECORD THE START TIME SO
```

THAT WE WILL BE ABLE TO DELAY SOME IN CASE GEM KEYS
ARRIVE TOO SOON AFTERWARDS.
*********************************************************** }

```
$ GLOBPROC ON$

PROCEDURE kbd_release_rpg ;
BEGIN
   IF sweep_ready.f THEN
   ELSE
      BEGIN
         set_flag( sweep_ready ) ;
         system_clock( time_sweep_ready );
      END ;
END ;

$ GLOBPROC OFF $
```

{ ***********************************************************
   THE MANUAL PARSER IS ASKING FOR A GEM KEY.  BEFORE WE
   SEE IF WE HAVE ONE TO GIVE IT, WE MAKE SURE A SHORT
   TIME HAS PASSED SINCE THE SWEEP STARTED WITH THE LAST
   CHANGE.
   *********************************************************** }

```
PROCEDURE wait_for_sweep_ready;
VAR
   gem_timer : timer;
   min_delay,
   gem_delay,
   current_time : signed_32;
BEGIN {  If we have accumulated counts, then we shouldn't wait
      because there are more counts available to process.
      This isn't how it used to work.  We may want to take
      this out or put a fancier check.  Like if the
      rpg_function requested time for a screen update. }

{IF accumulator = 0 THEN BEGIN}
      {  We want to wait a bit after the sweep has begun.  We
         decide to wait 1.3 * sweep time OR MAX_GEM_DELAY
         (1/10 sec) which ever is smaller.  This amount of
         time is stored as min_delay. } min_delay := state.swp_time * 1.3L6;
      IF min_delay > MAX_GEM_DELAY THEN
         min_delay := MAX_GEM_DELAY;

{  We now wait until the sweep is ready to start.  When
         this flag is set, the time at which the sweep when
         ready is recorded in time_sweep_ready. }
```

```
        wait_flag (sweep_ready);

{   Since we may have woken up late (late enough to have
        min_delay seconds already pass, or at least
        partially pass), we calculate how much more we still
        have to wait.  We will wait, gem_delay, which is the
        difference between what we want to delay and the
        amount of time that has already passed.} system_clock( current_time ) ;
        gem_delay := min_delay - current_time + time_sweep-
           _ready;
        IF (gem_delay > 0) AND (gem_delay <= min_delay) THEN
            delay (gem_timer, gem_delay);
    {END;}
END;

{ ************************************************************
    THE MANUAL FIFO IS THE COMMUNICATION LINK FOR ALL GEM
    RPG AND KEYS BETWEEN THE KEYBOARD PROCESS AND THE
    MANUAL PARSER.  STORED IN THE MANUAL FIFO ARE PAIRS OF
    DATA:  A TYPE DESCRIBING WHAT KIND OF GEM KEY WAS USED
    AND THE DATA DESCRIBING THE KEY.  THE ROUTINES
    PUT_KEYBOARD_DATA AND GET_KEYBOARD_DATA ARE THE ONLY
    ACCESS TO THIS FIFO.  GET_KEYBOARD_DATA IS CALLED BY
    THE MANUAL PARSER PROCESS.
  ************************************************************ }

$ GLOBPROC ON $

PROCEDURE put_keyboard_data (type: keyboard_data_ type; data:
                             INTEGER);
BEGIN
    IF fifo_remaining (manual_fifo) >= 3 THEN
        IF (test_fifo_empty (manual_fifo)) OR (type <>
        last_pkd_type) OR (data <> last_pkd_data) THEN BEGIN
            put_fifo_byte (manual_fifo, byte (type));
            put_fifo_word (manual_fifo, word (data));
            last_pkd_type := type;
            last_pkd_data := data;
        END;
END;

$ GLOBPROC OFF $

{ ************************************************************
    WE KEEP RPG COUNTS UNTIL IT IS TIME TO FLUSH THEM TO
    THE MANUAL PARSER.  THE TIMES ARE:  THE MANUAL PARSER
    IS ABOUT TO WAIT ON AN EMPTY MANUAL FIFO, A KEYPRESS
    JUST ARRIVED, THE DISPLAY HAS ASKED US TO TURN ITS PATH
    OFF, OR A NEW RPG COUNT HAS ARRIVED AND THE MANUAL
```

```
    PARSER IS ALREADY WAITING FOR SOMETHING.
    ************************************************** }

PROCEDURE flush_rpg;
BEGIN
    IF accumulator <> 0 THEN BEGIN
        { We can go to sleep here if the manual_fifo is full }
        IF accumulator = 0 THEN accumulator := 1;
        IF flushing_rpg IN select_request THEN
            call_kbd_function (accumulator, manual_waiting,
                                flushing_rpg);
        manual_waiting := FALSE;{ It's going to wake up now }
        put_keyboard_data (rpg, accumulator);
        accumulator := 0;
        accumulator_valid := false;
    END;
END;

{ **************************************************************
    THE MANUAL PARSER IS ASKING FOR ANOTHER KEY FROM THE GEM
    ************************************************** }

$ GLOBPROC ON $

PROCEDURE get_keyboard_data( VAR type : keyboard_data_type ;
                             VAR data : INTEGER ) ;
VAR foo: integer;   { dummy }

BEGIN
    IF NOT abort_manual THEN BEGIN
        wait_for_sweep_ready;
        manual_waiting := TRUE;
        flush_rpg;
        IF NOT extract_fifo_byte (manual_fifo, byte (type))
                    THEN BEGIN
            couple_on_empty (manual_fifo);
            get_fifo_byte (manual_fifo, byte (type));
        END;
        manual_waiting := FALSE;
        get_fifo_word (manual_fifo, word (data));
    END;
    IF abort_manual THEN BEGIN
        type := keyboard;
        data := NO_KEY_PRESSED;
    END;
END;

$ GLOBPROC OFF $

{ **************************************************************
    ACCUMULATE ANOTHER RPG COUNT.  IF THE MANUAL PROCESS IS
    WAITING FOR SOMETHING (ON AN EMPTY FIFO), WE FLUSH THE
```

ACCUMULATED COUNTS TO IT (SHOULD JUST BE THIS ONE).
*********************************************** }

```
PROCEDURE accum_rpg (count: integer);
BEGIN
   accumulator := accumulator + count;
   IF count <> 0 THEN
      accumulator_valid := true;
   {IF manual_waiting THEN flush_rpg;}
END;
```

{ ***********************************************
   WE GOT A STATUS BYTE FROM THE GEM ASKING FOR SOME SORT
   OF CONTROL CHANGE.  PROCESS THE CHANGE HERE.
   *********************************************** }

```
PROCEDURE process_change (change: kbd_status_type) ;
BEGIN
   kbd_status := kbd_status - [change];
   flush_rpg;
   CASE change OF
      readybit    : set_flag (disp_ready);
      gotoremote  : put_keyboard_data (chg_src_ctl, 0);
      gotolocal   : put_keyboard_data (chg_src_ctl, 1);
   END;
END;
```

{ ***********************************************
   WE GOT A STATUS BYTE FROM THE GEM SAYING THAT A KEY HAS
   BEEN PRESSED.  WE GO OUT AND GET IT AND GIVE IT TO THE
   MANUAL PROCESS.
   *********************************************** }

```
PROCEDURE process_keypress (VAR abort: boolean) ;

VAR
   temp_byte   : byte ;
   local_str   : PACKED ARRAY [0..7] OF CHAR ;
                 { *** decrease this ** }
   data        : integer;

BEGIN

IF current_clear_on_key THEN write_message (0,
            FALSE, "");

local_str := "KY1;" ;            { get which key fm GEM }
   acquire_display ;
   out_string( kbd_path, local_str ) ;
   data := NO_KEY_PRESSED;
   temp_byte := get_kbd_data (abort) ;
   IF (CHR(temp_byte) = '#') AND NOT abort THEN
```

```
            BEGIN
               temp_byte := get_kbd_data (abort) ;
               IF (CHR(temp_byte) = 'I') AND NOT abort THEN
                  data  := get_kbd_int (abort) ;
            END;
            release_display ;
            IF kbd_path_ready AND ( data <> NO_KEY_PRESSED ) THEN
               BEGIN flush_rpg;
                  put_keyboard_data (keyboard, data);
            END;
            kbd_status := kbd_status - [keypress];
      END ;

{ ************************************************************
         IN ORDER TO CALCULATE THE VELOCITY OF THE RPG TURNING,
         WE NEED TO KNOW THE TIMES WE GOT COUNTS.  THIS ROUTINE
         CALCULATES THE TIME SINCE THE LAST RPG AND SETS
         RPG_PERIOD.  IT IS GLOBAL SO THAT THE REMOTE RPG
         COMMAND CAN ALSO DO ACCELERATION CALCULATIONS.
         ************************************************************ }

$ GLOBPROC ON $

PROCEDURE record_rpg_time;
      VAR
         current_time,
         temp_time:   signed_32;

BEGIN
         system_clock( current_time ) ;
         temp_time := current_time - rpg_time_last;
         IF ( temp_time >= MAX_RPG_PERIOD) OR
            ( temp_time <= 0) THEN
            rpg_period := MAX_RPG_PERIOD
      ELSE
         rpg_period := temp_time;
       rpg_time_last := rpg_time_last + temp_time;
      END;

$ GLOBPROC OFF $

{ ************************************************************
         ASSUMING WE JUST GOT A STATUS BYTE SAYING AN RPG COUNT
         IS AVAILABLE, GO ASK FOR THE COUNT.
         ************************************************************ }

FUNCTION get_rpg_count (VAR abort: boolean): integer;
      VAR
         temp_byte   : byte;
         local_str   : PACKED ARRAY[0..7] OF CHAR;
      BEGIN
         local_str := 'RP1;';
```

```
      acquire_display;
      out_string ( kbd_path, local_str);
      get_rpg_count := 0;
      temp_byte := get_kbd_data (abort);
      IF (CHR (temp_byte) = '#') AND NOT abort THEN BEGIN
         temp_byte := get_kbd_data (abort);
         IF (CHR (temp_byte) = 'I') AND NOT abort THEN
            get_rpg_count := get_kbd_int (abort);
  END;
  release_display;
  kbd_status := kbd_status - [rpgturn];
  record_rpg_time;
END;

{ ************************************************************
    MULTIPLY THE GIVEN RPG COUNT BY THE VELOCITY OF THE
    KNOB.  LIMITS AND SCALE ARE PUT ON THE VELOCITY TO MAKE
    IT BETWEEN 1 AND 4.
    ************************************************************ }

FUNCTION accel (raw_rpg: signed_16) : signed_16;
VAR
    motion: signed_32;
    accel_factor: signed_32;
    accel_motion: signed_32;
    rpg_sign: boolean;
BEGIN
    IF rpg_accel THEN BEGIN
       motion := raw_rpg;
       rpg_sign:= false;
       IF motion < 0 THEN BEGIN
          motion    := -motion;
          rpg_sign  := true;
       END;
       accel_factor := motion * 2666667 / rpg_period;
       IF accel_factor > 128 THEN accel_factor := 128;
       IF accel_factor < 32  THEN accel_factor := 32;
       accel_motion := motion * accel_factor / 32;
       IF accel_motion = 0 THEN accel_motion := 1;
       IF rpg_sign THEN accel_motion := -accel_motion;
       accel := accel_motion;
    END ELSE
       accel := raw_rpg;
END;

{ ************************************************************
    WAIT max_wait USECONDS FOR THE KNOB TO TURN.  RETURN
    SOONER IF THE GEM SENT US SOMETHING IMPORTANT.  RETURNS
    US THE NEW PACKET FROM GEM.
    ************************************************************ }

FUNCTION wait_for_turn (max_wait: signed_32; VAR abort:
```

```
            boolean): cmd_packet;
VAR
    rpg_timer:timer;
    current_time,
    stop_time:signed_32;
    next_packet:cmd_packet;
    scratch:integer;

BEGIN
    next_packet := cmd_packet (0);
    system_clock( current_time ) ;
    stop_time  := current_time + max_wait;
    REPEAT
        scratch := 1;
        IF waiting_for_turn IN select_request THEN
            call_kbd_function (scratch, manual_waiting,
            waiting_for_turn);
        IF scratch > 0 THEN  BEGIN
            delay (rpg_timer, TURNING_CHECK_TIME);
            next_packet := read_the_kbd (FALSE, abort);
            IF next_packet <> cmd_packet (0) THEN BEGIN
                IF (next_packet.command <> switch_control) AND
                   (NOT (KEY_PENDING <= next_packet.bits)) AND
                   (NOT (RPG_PENDING <= next_packet.bits)) THEN
                    BEGIN
                    next_packet := read_the_kbd (TRUE, abort);
                    next_packet := cmd_packet (0);
                END;
            END;
        END;
        system_clock( current_time ) ;
    UNTIL (stop_time < current_time)
        OR (next_packet <> cmd_packet (0))
        OR (abort) OR (scratch = 0);
    wait_for_turn := next_packet;
END;

{ *************************************************************
    WE HAVE JUST RECEIVED A STATUS BYTE FROM THE GEM SAYING
    THAT AN RPG COUNT IS AVAILABLE.  WE GO GET THE COUNT.
    IF IT HAS BEEN AWHILE SINCE WE GOT THE LAST COUNT
    (>MAX_RPG_PERIOD) WE ASSUME THAT THE KNOB HAD STOPPED
    AND IS NOW STARTING TO TURN.  IN ORDER TO CALCULATE THE
    KNOBS SPEED WE NEED TO GET ANOTHER KNOB COUNT.  BUT IF
    THE KNOB JUST MOVED A TINY BIT, THERE MAY NOT BE
    ANOTHER KNOB COUNT.  THEN WE NEED TO KNOW IF THERE ARE
    MORE RPG COUNTS WAITING SO WE CAN ASK THE RPG_FUNCTION
    WHAT TO DO IN SUCH A CASE.
   ************************************************************* }

PROCEDURE process_rpg (VAR abort: boolean);
```

```
VAR
    first_accel_point       : boolean;
    count                   : integer;
    rpg_timer               : timer;
    next_packet             : cmd_packet;
    time,orig_time          : signed_32;
    read_again              : integer {boolean};
BEGIN
    first_accel_point := FALSE;        { Assume this isn't a
                                         first rpg }
    knob_could_be_turning := TRUE;     { It is possible knob is
                                         turning }
    count := get_rpg_count (abort);    { Get the raw rpg delta
                                         count}

{ Handle "single point"
                                         acceleration }

IF (rpg_period >= MAX_RPG_PERIOD) AND NOT abort THEN BEGIN
        next_packet := wait_for_turn (ACCEL_INTERVAL, abort);
        IF (next_packet.command = status) AND
           (RPG_PENDING <= next_packet.bits) AND NOT abort THEN
              BEGIN
                 first_count := count;
                 first_accel_point := TRUE;
        END;
    END;

IF (NOT first_accel_point) AND (NOT abort) THEN BEGIN count := count + first_count;
        first_count := 0;
        count := accel (count);

{ Count is now a real accelerated point. We keep track
          of the elapsed time calling the "user" rpg function
          so we can guess if the knob is still turning. }

IF just_got_rpg IN select_request THEN
            call_kbd_function (count, manual_waiting,
              just_got_rpg);
        accum_rpg (count);

{* Now see if the knob is currently turning! *} read_again := 0;{ assume false }
        IF rpg_turning IN select_request THEN BEGIN
            next_packet := wait_for_turn
                (COULD_STILL_BE_TURNING, abort);
            IF (next_packet.command = status) AND
               (RPG_PENDING <= next_packet.bits) AND
               (NOT abort) THEN BEGIN
```

```
                    {*** Knob is really still turning ***}
                    call_kbd_function (read_again,
                        manual_waiting, rpg_turning);
            END;
      END;

IF read_again = 0 {false} THEN BEGIN
         knob_could_be_turning := FALSE;
         IF manual_waiting THEN
            flush_rpg
         ELSE IF waiting_for_manual IN select_request THEN
            call_kbd_function (count, manual_waiting,
                waiting_for_manual);
      END;
   END;
   kbd_status := kdb_status - [rpgturn];
END;

{ ************************************************************
    SET THE ACTIVE PARAMETER KEYBOARD PROCESS FUNCTIONS
    GIVEN THE NEW ACTIVE PARAMTER COMMAND.  THIS IS CALLED
    BY UPDATE_ACT_LABEL IN EXEC1 BY THE MANUAL PROCESS AS
    NEW ACTIVE PARAMETER COMMANDS ARE ACTIVATED.
    ************************************************************ }

$ GLOBPROC ON $

PROCEDURE set_act_kbd_function (command: pdc_type);
VAR
    scratch:    integer;
BEGIN
    IF good_bye IN select_request THEN
       call_kbd_function (scratch, manual_waiting,
           good_bye);
    IF state.panning THEN BEGIN
       CASE command OF
            cmd_cf:       kbd_function := pointer(ADDR(cf_kbd_
                              function));
            cmd_fa:       kbd_function := pointer(ADDR(fa_kbd_
                              function));
            cmd_fb:       kbd_function := pointer(ADDR(fb_kbd_
                              function));
            cmd_sp:       kbd_function := pointer(ADDR(sp_kbd_
                              function));
            OTHERWISE
                          kbd_function := pointer (0);
       END;
       scratch := 0;
       call_kbd_function (scratch, manual_waiting, init_func);
       select_request := kbd_select_set (scratch);
    END ELSE BEGIN
       kbd_function := pointer (0);
```

```
        select_request := kbd_select_set (0);
     END;
END;

$ GLOBPROC OFF $

{ *********************************************************
     THE KEYBOARD PROCESS.  IT JUST GETS STATUS BYTES FROM
     THE GEM AND PROCESSES THEM.  ABORT MEANS THE PATH WAS
     TURNED OFF BY THE GEM.
  ********************************************************* }

PROCEDURE keyboard_process;
VAR
   packet: cmd_packet;
   abort: boolean;
BEGIN
   REPEAT
      abort := false;
      WHILE (kbd_status = []) DO packet := read_the_kbd
         (TRUE, abort);
      abort := false;
      IF        readybit    IN kbd_status THEN process_change
         (readybit);
      IF        gotoremote  IN kbd_status THEN process_change
         (gotoremote)
      ELSE IF gotolocal    IN kbd_status THEN process_change
         (gotolocal)
      ELSE IF keypress     IN kbd_status THEN process_keypress
         (abort)
      ELSE IF rpgturn      IN kbd_status THEN process_rpg
         (abort);
   UNTIL FALSE;
END;

{ *********************************************************
     START THE KEYBOARD PROCESS.
  ********************************************************* }

$ GLOBPROC ON $

PROCEDURE keyboard_init_vars;
BEGIN
   first_key := false;
   use_previous := false;
   we_suspend_trace := false;
   first_count := 0;
   accumulator := 0;
   accumulator_valid := false;
   {gem_version := 2;}
   manual_waiting := FALSE;
   keyboard_waiting := FALSE;
```

```
    rpg_accel := TRUE;
    knob_could_be_turning := FALSE;
    enable_kbd_function := TRUE;
    kbd_function := pointer (0);
    kbd_path_ready:=FALSE;                  { prevent output
                                              until path ready }
    kbd_status := [] ;
    select_request := [];
END;

PROCEDURE keyboard_init( degree : start_temp ) ;
VAR
    my_addrs: address;
    process_addr: procedure_ptr;
BEGIN
    init_flag( sweep_ready ) ;
    init_flag (disp_ready) ;
    set_flag( sweep_ready ) ;
    system_clock( time_sweep_ready );
    my_addrs:=controller_address;           {get our MTM address}
    init_fifo(kbd_fifo,ADDR(kbd_buffer),KBD_BUFLEN) ;
    init_fifo(manual_fifo,ADDR(manual_buffer),MAN_BUFLEN) ;
    kbd_path:=enable_keyboard_path(my_addrs,ADDR(kbd_fifo));
    end_packet.command:=msg_end;
    get_proc_addr (process_addr); keyboard_process;
    fork (kbd_pcb, key_priority,ADDR(key_stack),key_stacksize,
        process_addr);
END {of procedure};

$ GLOBPROC OFF $
```

"68000" PREPROCESS        compile

```
{ @(#)exec_freq.P6.10 }
$ BASE_PAGE $
PROGRAM exec_freq ;

{ ************************************************************
  ************************************************************
                                                          
                                                          
                     E X E C _ F R E Q                    
                                                          
                                                          
  ************************************************************
  ************************************************************ }

$ WARN OFF $
$ EXTENSIONS $
$ OPTIMIZE ON $

# INCLUDE /users/msa/pub/g_system.h
# INCLUDE /users/msa/pub/g_opsys.h
# INCLUDE /users/msa/pub/g_error.h
# INCLUDE /users/msa/pub/g_cn_misc.h
# INCLUDE /users/msa/pub/g_display.h
# INCLUDE /users/msa/pub/g_command.h
# INCLUDE /users/msa/pub/g_parms.h
# INCLUDE /users/msa/pub/g_state.h
# INCLUDE /users/msa/pub/g_execute.h
# INCLUDE /users/msa/pub/g_bits.h
# INCLUDE /users/msa/pub/g_io_path.h
# INCLUDE /users/msa/pub/g_dconst.h
# INCLUDE /users/msa/pub/g_trace.h
{ # INCLUDE /users/msa/pub/g_md.h }

$ BASE_PAGE $

CONST
   half = 0.5L0 ;
   smallest_span = 10.0L0 ;
   FAST_SWEEP = 0.25L0;
   one = 1024;
   PARTS_DONE = 99;
   GEM_CAN_HOLDOFF = 1;

TYPE
   {*** These are used for the keyboard functions ***}
   kbd_func_select = (just_got_rpg, rpg_turning,
      flushing_rpg, waiting_for_manual,
      init_func, good_bye, waiting_for_turn);
   kbd_select_set  = SET OF kbd_func_select;
```

```
    logstep_type        = (logstep_125, logstep_13);

VAR
    kbd_frequency       : longreal;
    new_start,
    new_span            : longreal;         { rpg setting }
    kbd_static          : integer;
    last_rel_start      : longreal;
    last_rel_span       : longreal;
    buckets, part       : integer;
    first_man_waiting   : boolean;
    have_panned         : integer;
    center_freq         : longreal;

$GLOBVAR ON$
VAR
    the_trace           : trace_addr;       { stuff for partial
                                              interps }
    interp_source, interp_inc,
    scaled_buckets      : longinteger;
    interp_dest         : integer;
    we_suspended_trace  : boolean;
    pan_pen_up          : boolean;          { note to ourselves
                                              that pen is up }
    limit_resbw_zoom    : boolean;          { limit res_bw on
                                              NEXT zoom_span only }
    resbw_zoom          : freq_type;        { limit res_bw to...} debug_data          : integer;
    debug_select        : kbd_func_select;

$GLOBVAR OFF$ $ EXTVAR ON $
VAR
    setting_lo,
    user_set_lo         : boolean;
    force_new_path      : boolean;
    abort_execute       : boolean;
    disp_act_cmd        : pdc_type ;
    trace_on_screen     : boolean;
    active_trace        : integer;
    trace_has_display   : boolean;
    gem                 : resource;
    status_path         : integer;
    start_blob          : flag;
    stop_blob           : boolean;
    blob_on             : boolean;
    dont_stop_blob      : boolean;
    uval, tval,
    vval, wval          : integer;          { current trace scale
                                              (don't change) }
```

```
    trace_lower_clip    : word;
    {gem_version        : integer;}
    kbd_path_ready      : boolean;
    UPDATE_TRACK        : boolean ;
    {pb_ptr             : p_functional_block;}

MD_did_update_sequence : boolean;

$ FAR $
    step_table_13       : step_table_type ;
    step_table_125      : step_table_type ;
    rpg_log_steps       : ARRAY[logstep_type] OF longreal;
    rpg_trace           : ARRAY[0..1023] OF integer;

$ BASE_PAGE $
$ EXTVAR OFF $ $ LIB_ABS_SHORT $
$ CALL_ABS_SHORT $

# INCLUDE /users/msa/pub/p_os_reso.h
# INCLUDE /users/msa/pub/p_util.h
INCLUDE /users/msa/pub/p_os_time.h $ CALL_ABS_LONG $

INCLUDE /users/msa/pub/p_exec.h
# INCLUDE /users/msa/pub/p_ex_parm.h
# INCLUDE /users/msa/pub/p_trace1.h
# INCLUDE /users/msa/pub/p_md.h
# INCLUDE /users/msa/pub/p_markers.h
# INCLUDE /users/msa/pub/p_md_set.h
# INCLUDE /users/msa/pub/p_md_band.h
# INCLUDE /users/msa/pub/p_dact.h
# INCLUDE /users/msa/pub/p_dedg.h
# INCLUDE /users/msa/pub/p_dcur.h
# INCLUDE /users/msa/pub/p_string.h
INCLUDE /users/msa/pub/p_io_2.h {------------------------------------------------------------------}
(    Interface to other execute routines   }

PROCEDURE set_flag (VAR f: flag);                           EXTERNAL ;
PROCEDURE add_cntl_error(err:err_msg_type);                 EXTERNAL ;
PROCEDURE sweep_time_coupling( auto: boolean ) ;            EXTERNAL ;
PROCEDURE set_sweep_time( new_sweep_time :
         time_type ) ;                                      EXTERNAL ;
FUNCTION best_sweep_time( a,b,c: longreal):
         longreal;                                          EXTERNAL ;
PROCEDURE new_meas_state ;                                  EXTERNAL ;
PROCEDURE select_emim_band ;                                EXTERNAL ;
FUNCTION freq_resolution( out_path :
```

```
              output_device ): integer ;                    EXTERNAL ;
FUNCTION span_resolution( out_path :
              output_device ): integer;                     EXTERNAL ;
PROCEDURE compute_freq_accuracy;                            EXTERNAL ;
PROCEDURE md_recompute_bands;                               EXTERNAL ;
PROCEDURE immediate_so_update                               EXTERNAL ;
FUNCTION md_extif_available: boolean;                       EXTERNAL ;

FUNCTION step_up_log(   prev : longreal ;
        VAR table : step_table_type ) :
        longreal ;                                          EXTERNAL ;

FUNCTION step_down_log(    prev : longreal ;
        VAR table : step_table_type ) :
        longreal ;                                          EXTERNAL ;
PROCEDURE step_into_zero( VAR source :
        command_source_type ;   VAR value :
        longreal ;  step_in : longreal ;
        step_out : longreal ; signed :
        boolean ) ;                                         EXTERNAL ;
FUNCTION  display_path: integer;                            EXTERNAL ;
PROCEDURE group_item_string (group, item:
        integer; VAR str:string);                           EXTERNAL ;
PROCEDURE group_string (group: integer;
        VAR s:string);                                      EXTERNAL ;
PROCEDURE acquire_display;                                  EXTERNAL ;
PROCEDURE release_display;                                  EXTERNAL ;
PROCEDURE out_disp_string (path: integer;
        VAR value: string);                                 EXTERNAL ;
FUNCTION  trace_disp_ready: boolean;                        EXTERNAL ;
PROCEDURE write_message (n: integer; clear:
        boolean; other: string);                            EXTERNAL ;
PROCEDURE rpg_step_linear (VAR v:longreal;
        s:longreal; rpg:integer);                           EXTERNAL ;
PROCEDURE rpg_step_log (VAR v:longreal;
        s:longreal; rpg:integer);                           EXTERNAL ;
PROCEDURE update_dscale_nocalc;                             EXTERNAL ;
PROCEDURE send_scale (p,a,b,c,d: integer);                  EXTERNAL ;
PROCEDURE update_blankahead;                                EXTERNAL ;
PROCEDURE suspend_trace_processing;                         EXTERNAL ;
PROCEDURE resume_trace_processing;                          EXTERNAL ;
PROCEDURE display_end;                                      EXTERNAL ;
FUNCTION  get_trace_addr (i: signed_16):
        trace_addr;                                         EXTERNAL ;
PROCEDURE display_trace (i: integer);                       EXTERNAL ;
PROCEDURE interp_point;                                     EXTERNAL ;
PROCEDURE set_act_kbd_function (cmd: pdc_type);             EXTERNAL ;
PROCEDURE want_cpl_resbw;                                   EXTERNAL ;
PROCEDURE need_curr_val (a: display_annun);                 EXTERNAL ;
PROCEDURE need_active_value (line: INTEGER);                EXTERNAL ;
PROCEDURE do_sweep_coupling;                                EXTERNAL ;
PROCEDURE set_resbw (f: freq_type);                         EXTERNAL ;
```

```
PROCEDURE exe_mktrack (VAR s: command_source_
          type; f: execrtn_function;  VAR r:
          boolean);                                    EXTERNAL ;
PROCEDURE exe_mkpk (VAR s: command_source_type;
          f: execrtn_function;  VAR r: integer);       EXTERNAL ;
{FUNCTION  search_range (VAR t,l: longreal;
          VAR r: range_type; tr: rounding_type):
          boolean;                                     EXTERNAL ;}

$GLOBPROC ON$
PROCEDURE set_span( new_span : longreal ):             FORWARD;
$GLOBPROC OFF$ $ CALL_PC_SHORT $ { To limit start freq so lo feedthrough doesn't show with
  optical.  EK }

FUNCTION min_start: freq_type;
BEGIN
   min_start := max (8 * state.res_bw, 100000L0);
END;

{---------------------------------------------------------------}
{     Start frequency is shown to at least 3 significant        }
{     digits, but never to more than 1Hz resolution.            }

$ GLOBPROC ON $

FUNCTION get_fa_resolution( num:longreal ): integer ;
BEGIN
   get_fa_resolution:= imin( imax( 0, log10(num)-2),
      freq_resolution( dev_crt ));
END;

$ GLOBPROC OFF $

{---------------------------------------------------------------}
{     Show the frequency parameters in the current mode.        }

$ GLOBPROC ON $

PROCEDURE show_freq_parm ;

BEGIN
   need_curr_val (ann_freq1);          { simplified 9/87 into
                                         disp_ann.P } need_curr_val (ann_freq2);
END ;
 $ GLOBPROC OFF $
```

{------------------------------------------------------------}
{ Set frequency annunciatoion mode and display proper freqs.}

$ GLOBPROC ON $

PROCEDURE set_frq_ann_mode( new_frq_mode : freq_mode_type ) ;

BEGIN
    IF new_frq_mode <> state.frq_ann_mode THEN_ BEGIN
        IF new_frq_mode = cf_span THEN BEGIN
            annunciator_on_off( ann_startf_label, false ) ;
            annunciator_on_off( ann_cf_label, true ) ;
            annunciator_on_off( ann_stopf_label, false ) ;
            annunciator_on_off( ann_span_label, true ) ;
            END
        ELSE BEGIN
            annunciator_on_off( ann_cf_label, false ) ;
            annunciator_on_off( ann_startf_label, true ) ;
            annunciator_on_off( ann_span_label, false ) ;
            annunciator_on_off( ann_stopf_label, true ) ;
            END;
        state.frq_ann_mode := new_frq_mode;
        show_freq_parm ;
        END ;
    END;

$ GLOBPROC ON $
{------------------------------------------------------------}
{    update_start_freq   }

PROCEDURE update_start_freq ;
{ WARNING - you must call begin_update_sequence/end_update_
            sequence when calling this routine. All other
            update_xxx routines call them for you, but
            update_start_freq is called by the md process
            during marker track, and cannot call them.       }

BEGIN
    user_set_lo:= setting_lo;        { Enable rbw_freq_corr if
                                       not using exe_lostart }
    WITH state DO BEGIN
        select_emim_band;    { This selects the default band
                               for external mixers. }
        start_freq := md_set_start( start_freq );
        show_freq_parm;
    END ;
    new_meas_state ;
    END ;

{------------------------------------------------------------}

{    set start frequency   }

PROCEDURE set_start_freq( new_start : longreal ) ;
{ WARNING - you must call begin_update_sequence/end_update_
            sequence when calling this routine. All other
            update_xxx routines call them for you, but
            set_start_freq is called by the md process
            during marker track, and cannot call them.        }
BEGIN
   WITH state DO BEGIN
      start_freq := new_start ;
      END ;
   update_start_freq ;
   END ;

$ GLOBPROC OFF $

{------------------------------------------------------------}
{    Pan the trace immediately to give rough visual          }
{    indication before a new trace is displayed.             }

PROCEDURE pan_trace( current_cf, new_cf : longreal );

VAR
   total_pan:  longreal;
   this_pan:   INTEGER;
   panstr:     PACKED ARRAY[0..79] OF char;

BEGIN
    IF trace_on_screen AND trace_disp_ready THEN_ BEGIN
       WITH state DO BEGIN
         IF span > 1.0L0 THEN_ BEGIN
            { calculate how much to scoot the trace }
            total_pan := (current_cf - new_cf) * num_buckets
               / span;
            this_pan  := ROUND (total_pan) - have_panned;
            group_item_string (trace_group, active_trace+1,
               panstr);
            concat_str (panstr, 'PN');
            integer_string (this_pan, 5, ADDR(panstr));
            concat_str (panstr, ';PU;');   {took out PR}
            acquire_display;
            out_disp_string (status_path, panstr);
            pan_pen_up := true;
            release_display;
            have_panned := have_panned + this_pan;
         END;
      END; {with}
   END; {trace_on_screen}
END; {procedure}

{*************************************************************
    WHEN CHANGES ARE BEING MADE TO THE TRACE ITSELF, WE
    HAVE TO STOP THE MEASUREMENT DIRECTOR FOR MESSING WITH
    IT.  WHEN WE ARE DONE, WE MUST REMEMBER TO ALLOW THE
    MANUAL PARSER CONTROL BEFORE THE TRACE PROCESSOR GETS
    TO RUN (THANK GOODNESS IT HAS THE LOWEST PROCESS
    PRIORITY).
**************************************************************}

PROCEDURE freeze_trace;
BEGIN
   IF NOT we_suspended_trace THEN BEGIN
      we_suspended_trace := TRUE;
      begin_update_sequence;
      suspend_trace_processing;
   END;
END;

PROCEDURE unfreeze_trace;
VAR
    temp_str:  PACKED ARRAY[0..5] OF CHAR;
BEGIN
   IF we_suspended_trace THEN BEGIN
      resume_trace_processing;
      end_update_sequence;
      we_suspended_trace := FALSE;
   END;
END;

PROCEDURE clip_string (start, length: integer; VAR foo:
                       string);
BEGIN              { adds 25 to string }
   concat_str (foo, 'TP');
   integer_string (start, 5, ADDR(foo));
   concat_str (foo, ';BA');
   integer_string (length, 5, ADDR(foo));
   concat_str (foo, ';PU;GA0;PD;');
END;

{*************************************************************
    USING THE GEM COMMANDS:  PN, SC, OR, AND DX, WE CAN
    QUICKLY CHANGE THE LOOK OF THE CURRENTLY DISPLAYED
    TRACE.  INPUT TO THIS ROUTINE SPECIFY RELATIVE CHANGE.
    REL_START AND REL_SPAN IS BASED ON 0.0 BEING THE
    CURRENT START FREQUENCY AND 1.0 BEING THE CURRENT SPAN.
    NOTICE THAT IF REL_START IS 1.0, THEN IT IS EQUAL TO
    THE CURRENT STOP FREQUENCY (CURRENT START PLUS ONE
    SPAN).  IF REL_SPAN IS 2.0 THEN IT IS TWICE THE
    CURRENT SPAN.  IF REL_START IS -2.0 THEN IT IS TWO

SPANS LESS THAN THE CURRENT START FREQUENCY. VALUES
WITHIN 0.0 AND 1.0 INDICATE WITHIN THE CURRENT SPAN,
OTHERS ARE OUTSIDE. WE ALSO NEED THE GLOBALS TVAL AND
UVAL WHICH SPECIFY WHAT THE CURRENT TRACE'S X-AXIS
SCALE IS. EK 6/3/87
********************************************************* }

```
PROCEDURE scale_trace (rel_start, rel_span: longreal);
VAR
    new_uval, new_tval,
    len, offset,
    clip_left, clip_right    : integer;
    rel_sum                  : longreal;
    {use_holdoff             : boolean;}
    tempstr                  : PACKED ARRAY[0..110] OF CHAR;

BEGIN
    last_rel_start   := rel_start;
    last_rel_span    := rel_span;

{*** CALCULATE NEW SCALE (TVAL, UVAL) ***}
    len              := uval - tval;
    offset           := ROUND(len * rel_start);
    new_tval         := tval + offset;
    new_uval         := tval + offset + ROUND(len * rel_span);

{*** CALCULATE CLIPPING ***}
    clip_left        := 0;
    clip_right       := 0;
    IF (rel_start > 0.0L0) THEN
        clip_left    := offset;
    rel_sum          := rel_start + rel_span;
    IF (rel_sum < 1.0L0) THEN
        clip_right   := ROUND(len * (1.0L0 - rel_sum));

freeze_trace;
    group_item_string (trace_group, active_trace + 1,
            tempstr);
    {use_holdoff    := gem_version >= GEM_CAN_HOLDOFF;}
    {IF use_holdoff AND kbd_path_ready THEN}
        concat_str (tempstr, 'HF1;');
    IF (clip_left > 0) THEN
        clip_string (0, clip_left, tempstr);
    IF (clip_right > 0) THEN
        clip_string (len - clip_right, clip_right, tempstr);
    IF (new_tval <> 0) THEN BEGIN
        concat_str (tempstr, 'OR');
        integer_string (-new_tval, 5, ADDR(tempstr));
        concat_str (tempstr, ',0;');
    END;
    IF (rel_span <> 1.0L0) THEN
        concat_str (tempstr, 'DX1;');
```

```
{IF use_holdoff THEN}
    concat_str (tempstr, 'HFO;');
acquire_display;
send_scale (status_path, new_tval, new_uval, vval, wval);
out_disp_string (status_path, tempstr);
release_display;
update_blankahead;{ does acquire/release_display }
END;

PROCEDURE init_some_interp;
BEGIN
    the_trace       := get_trace_addr (active_trace);
    buckets         := state.num_buckets;{ get from trace? }
    scaled_buckets  := (buckets - 1) * one;
    interp_dest     := 0;
    interp_source   := longinteger (last_rel_start * buckets
                                    * longreal (one));
    interp_inc      := longinteger (last_rel_span * longreal
                                    (one));
    part            := 1;
END;

PROCEDURE do_some_interp;
VAR
    stop_dest, n    : integer;
    out_this        : longinteger;
    f1, f2          : longinteger;
BEGIN
    $ OPTIMIZE OFF $
    CASE part OF
      1: BEGIN
            stop_dest := interp_dest + 100; { how much to do }
            IF (stop_dest >= buckets - 1) THEN BEGIN
               stop_dest := buckets - 1;
               part := PARTS_DONE;
            END;
            REPEAT
               interp_point;    { in execa.S,uses interp_dest}
            UNTIL (interp_dest > stop_dest);
         END;
      PARTS_DONE: ;
    END;
    $ OPTIMIZE ON $
END;

PROCEDURE restore_orig_trace (cmd: pdc_type);
VAR
    tempstr:    PACKED ARRAY [0..25] OF CHAR;
    grpstr :    PACKED ARRAY [0..17] OF CHAR;
    send_new :  boolean;
    {use_holdoff : boolean;}
BEGIN
```

```
        IF cmd <> cmd_cf THEN_ BEGIN
            WHILE part <> PARTS_DONE DO do_some_interp; { wait for
                                                          new trace ready }
            move_block (ADDR(rpg_trace), ptr_integer(the_trace),
                    buckets*2);
            acquire_display;
            update_dscale_nocalc;
            group_item_string (trace_group, active_trace + 1,
                            grpstr);
            {use_holdoff := gem_version >= GEM_CAN_HOLDOFF;}
            {IF use_holdoff AND kbd_path_ready THEN}
                tempstr := 'HF1;';
            concat_str (tempstr,'OR0,0;DX1;');
            out_disp_string (status_path, grpstr);
            out_disp_string (status_path, tempstr);
            release_display;
            display_trace (active_trace);{ show trace }
            {IF use_holdoff THEN}
                tempstr := 'HF0;';
            acquire_display;
            out_disp_string (status_path, tempstr);
            release_display;
        END;
    END;

{ ************************************************************
    FOR CENTER, START, AND STOP FREQUENCY GIVEN THE RPG
    COUNT, CALCULATE THE NEW ACTIVE VALUE, DISPLAY IT, AND
    UPDATE THE GRAPHICAL DISPLAY.
  ************************************************************ }

PROCEDURE freq_adjust_kbd_screen (cmd: pdc_type; rpg:
                                        integer);
VAR
    last_freq: longreal;

BEGIN
    IF rpg <> 0 THEN_ BEGIN

{*** GIVEN RPG COUNTS, CALCULATE NEW FREQUENCY AND
                        DISPLAY IT ***} last_freq := kbd_frequency;
        IF cmd = cmd_sp THEN
            rpg_step_log (kbd_frequency, rpg_log_steps
                        [logstep_125], rpg)
        ELSE
            rpg_step_linear (kbd_frequency, state.span * 0.1L0,
                        rpg);
        data_invalid;
        { this is for rpg, don't put in display process }
```

```
        display_active_value(2, kbd_frequency, hz_unit,
                        freq_resolution( dev_crt )) ;

{*** PERFORM THE DESIRED GRAPHICAL UPDATE FOR THE GIVEN
                        COMMAND ***}

IF cmd = cmd_cf THEN BEGIN
        freeze_trace;
        pan_trace (center_freq, kbd_frequency);

END ELSE BEGIN $ OPTIMIZE OFF $

WITH state DO BEGIN
            CASE cmd OF
                cmd_sp: BEGIN
                        new_start := start_freq + (span - kbd_
                                        frequency) / 2.0L0;
                        new_span  := kbd_frequency;
                    END;
                cmd_fa: BEGIN
                        new_start := kbd_frequency;
                        new_span  := span + start_freq - kbd_
                                        frequency;
                    END;
                cmd_fb: BEGIN
                        new_start := start_freq;
                        new_span  := kbd_frequency - start_freq;
                    END;
            END; { case }
            $ OPTIMIZE ON $ IF (span > 0.0L0) AND (new_span > 0.0L0) THEN
                scale_trace ( (new_start - start_freq) / span,
                    new_span / span );
        END; { with }
    END; { else }
  END;
END;

PROCEDURE init_kbd_freq (cmd: pdc_type);
BEGIN
    WITH state DO
        IF cmd = cmd_cf THEN BEGIN
            kbd_frequency := start_freq + span * 0.5L0;
            center_freq   := kbd_frequency;
            have_panned   := 0;
        END ELSE IF cmd = cmd_sp THEN
            kbd_frequency := span
        ELSE IF cmd = cmd_fa THEN
```

```
            kbd_frequency := start_freq
        ELSE {cmd = cmd_fb}
            kbd_frequency := start_freq + span;
    END;

{****************************************************
    THE GUTS OF A KEYBOARD FUNCTION WHICH IS FOR GENERAL
    USE FOR CHANGES TO THE FREQUENCY RANGE DISPLAYED ON THE
    SCREEN.
 **************************************************** }

PROCEDURE freq_kbd_function (VAR data: integer; man_waiting:
                                  boolean;
                                  select: kbd_func_select; cmd:
                                  pdc_type);
VAR
    select_set          : kbd_select_set;
    fract_span          : longreal;

$ OPTIMIZE OFF $

BEGIN
    IF debug_select <> select THEN BEGIN
        debug_data := data;
        debug_select := select;
    END;
    WITH state DO BEGIN
        CASE select OF {*** A NEW ACTIVE FUNCTION, SO INITIALIZE AND RETURN
                        SELECT SET ***} init_func:  BEGIN
                last_rel_start          := 0.0L0;
                last_rel_span           := 1.0L0;
                new_span                := span;
                init_some_interp;
                first_man_waiting       := TRUE;
                kbd_static              := 0;
                select_set              := [rpg_turning, flushing_rpg,
                                            waiting_for_manual,
                                            just_got_rpg,
                                            waiting_for_turn];
                data                    := integer (select_set);
            END;

rpg_turning:BEGIN   { will be called after just_got_rpg }
                data                    := 0;
            IF (span > 0.0L0) AND (new_span > 0.0L0) THEN BEGIN
                IF man_waiting THEN BEGIN
                    IF cmd = cmd_cf THEN BEGIN
```

```
                        fract_span := span * 0.1L0;
                            IF kbd_frequency > start_freq +
                                fract_span THEN
                                IF kbd_frequency <
                                    start_freq + span - fract_span
                                        THEN
                                    data := 1;
                END ELSE BEGIN
                    fract_span := new_span / span;
                    IF fract_span > 0.1L0 THEN
                        IF fract_span < 3.0L0 THEN
                            data := 1;
                END;
            END;
        END;
    END;

waiting_for_turn:   IF span > 0.0L0 THEN BEGIN
                        do_some_interp;
                        data := 1;          { wait for a turn }
                    END ELSE
                        data := 0;          { don't wait for a
                                              turn } flushing_rpg:       BEGIN
                        restore_orig_trace (cmd);
                        unfreeze_trace;
                        first_man_waiting:= TRUE;
                    END;

waiting_for_manual:
                    BEGIN
                        unfreeze_trace;
                    END;

just_got_rpg:       { Called just after the rpg count has
                      been read from the GEM and accelerated. }
                    BEGIN
                        IF span > 0.0L0 THEN BEGIN
                            IF man_waiting THEN BEGIN
                                IF first_man_waiting THEN BEGIN
                                    init_kbd_freq (cmd);
                                    first_man_waiting := FALSE;
                                END;
                                kbd_static := kbd_static + data;
                                freq_adjust_kbd_screen (cmd,
                                                kbd_static);
                                kbd_static := 0;
                            END ELSE BEGIN
                                first_man_waiting := TRUE;
                                data := 0;
```

```
                END;
                init_some_interp;
              END;
            END;
          END;
       END;
    END;
END;

$ OPTIMIZE ON $

{ ***********************************************************
     CENTER FREQUENCY KEYBOARD FUNCTION
  *********************************************************** }

$ GLOBPROC ON $

PROCEDURE cf_kbd_function (VAR data: integer; man_waiting:
                               boolean;
                               select: kbd_func_select);
BEGIN
   freq_kbd_function (data, man_waiting, select, cmd_cf);
END;

{ ***********************************************************
     SPAN FREQUENCY KEYBOARD FUNCTION
  *********************************************************** }

PROCEDURE sp_kbd_function (VAR data: integer; man_waiting:
                               boolean;
                               select: kbd_func_select);
BEGIN
   freq_kbd_function (data, man_waiting, select, cmd_sp);
END;

{ ***********************************************************
     START FREQUENCY KEYBOARD FUNCTION
  *********************************************************** }

PROCEDURE fa_kbd_function (VAR data: integer; man_waiting:
                               boolean;
                               select: kbd_func_select);
BEGIN
   freq_kbd_function (data, man_waiting, select, cmd_fa);
END;

{ ***********************************************************
     STOP FREQUENCY KEYBOARD FUNCTION
  *********************************************************** }
```

```
   PROCEDURE fb_kbd_function (VAR data: integer; man_waiting:
                                  boolean;
                              select: kbd_func_select);
BEGIN
   freq_kbd_function (data, man_waiting, select, cmd_fb);
END;

{---------------------------------------------------------------}
{ set center freq. called by exec_cf and by marker routine. }

PROCEDURE set_cf( new_cf : longreal ) ;
{ WARNING - you must call begin_update_sequence/end_update_
            sequence when calling this routine.  All other
            update_xxx routines call them for you, but
            set_cf is called by the md process during marker
            track, and cannot call them.        }

VAR
   new_start   : longreal;
   change      : longreal;
BEGIN
   WITH state DO BEGIN
      new_start := new_cf - span * half;
      IF signal_marker <> 0 THEN  BEGIN
         change := new_start - start_freq;
         IF change < 0L0 THEN change := - change;
         IF change > 10L0 * span THEN UPDATE_TRACK := TRUE;
      END;
      set_start_freq( new_start ) ;
      new_cf := start_freq + span * half ;

IF disp_act_cmd = cmd_cf THEN
         need_active_value (2);

IF frq_ann_mode = cf_span THEN
         need_curr_val (ann_freq1)
      ELSE
         show_freq_parm ;
      END ;
   data_invalid ;
   END;

$ GLOBPROC ON $
{---------------------------------------------------------------}
{    CF - execute center frequency command      }

PROCEDURE exe_cf( VAR source : command_source_type ;
                      function : execrtn_function ;
                  VAR value : longreal ) ;
VAR
   new_start, delta_start: freq_type;
```

```
BEGIN
   WITH state DO BEGIN set_frq_ann_mode(cf_span) ;

IF function = func_set THEN BEGIN
         setting_lo:= false;
         IF value <> start_freq + span * half + frq_offset
            THEN BEGIN
            begin_update_sequence;
         set_cf( value. - frq_offset ) ;
         end_update_sequence;
         END;
      END ;

value := start_freq + span * half + frq_offset ;

END ;
 END ;

$ GLOBPROC ON $
{-----------------------------------------------------------------}
{    CF - center frequency step size coupling function    }

PROCEDURE cpl_cf_step( VAR state : meas_state_type ) ;

BEGIN
   WITH state DO
      IF cf_step_auto THEN
         IF span <> 0 THEN
            cf_step := span * 0.1L0
         ELSE
            cf_step := res_bw ;
   END ;

$ GLOBPROC ON $
{-----------------------------------------------------------------}
{    SS - execute center frequency step size command    }

PROCEDURE exe_ss( VAR source : command_source_type ;
                  function : execrtn_function ;
                  VAR value : longreal ;
                  VAR cvalue : boolean ) ;

BEGIN
   WITH state DO BEGIN
      IF function = func_set THEN BEGIN
         step_into_zero( source, value, 1L0, 1L0, true ) ;
         cf_step := value ;
         cf_step_auto := false ;
```

```
                END;
            IF function = func_coupled THEN BEGIN
                cf_step_auto := cvalue;
                cpl_cf_step( state ) ;
                END ;
            value:= cf_step;
            cvalue:= cf_step_auto;
            END ;
        END ;

$ GLOBPROC ON $
{-----------------------------------------------------------------}
{   FOFFSET - frequency offset for all absolute frequencies       }
{   Added by Preston Newman on May 14, 1984   }

PROCEDURE exe_foffset (VAR source:command_source_type;
                            function : execrtn_function ;
                            VAR value:longreal);
BEGIN
    WITH state DO BEGIN
        IF function = func_set THEN BEGIN
            IF ABS(value) < 5L-4 THEN value:= 0L0;
            frq_offset := value;
            marker_couple;
            show_freq_parm;
            annunciator_on_off(ann_freq_offset,frq_offset<>0L0)
        END;
    value:= frq_offset;
    END;
END;

$ GLOBPROC ON $
{-----------------------------------------------------------------}
{   CS - execute couple center frequency step size command       }

PROCEDURE exe_cs( VAR source : command_source_type ;
                      function : execrtn_function ) ;
BEGIN
    state.cf_step_auto := true ;
    cpl_cf_step( state ) ;
    END ;

$ GLOBPROC ON $
{-----------------------------------------------------------------}

PROCEDURE update_span ;
BEGIN
    user_set_lo:= setting_lo;           { Enable rbw_freq_corr if
                                          not using exe_lostart. }
```

```
   WITH state DO BEGIN
      IF span < 0L0 THEN BEGIN
         span := 0L0 ;
         show_freq_parm ;
         END.
      ELSE IF span < 1L0 THEN
         span := 0L0 ;
      begin_update_sequence;
      span := md_set_span( span );
      want_cpl_resbw ;
      cpl_cf_step( state ) ;
      end_update_sequence;
      END ;
   new_meas_state ;           { This MUST be done before
                                compute_freq_ac if span changed
                                so marker_couple works ok. } compute_freq_accuracy;
   data_invalid ;
   END ;

{------------------------------------------------------------}

PROCEDURE set_span( new_span : longreal ) ;        (forward)
BEGIN
   state.span := new_span ;
   update_span ;
   END;

{------------------------------------------------------------}

PROCEDURE zoom_span( new_span : longreal ) ;
{ WARNING:  BE SURE YOU HAVE NOT CALLED begin_update_sequence
            SINCE THIS ROUTINE CALLS take_sweep.           }

{  This procedure sets span to new_span, leaving center
   unchanged.  If marker tracking is on this routine will do
   auto zoom for you.  First it locates the marker
   frequency.  Next if sweeptime is coupled, it couples
   sweeptime to a value which allows more amplitude
   inaccuracy (faster).  Then it takes a sweep, and steps
   span down until the desired span is within one sweep.  If
   sweeptime was coupled, it couples sweeptime to the
   accurate time.  It finishes by leaving span set to the
   user desired value.  The user must take the last sweep by
   using TS (just like when tracking is off). }
CONST
   half = 0.5L0;

VAR
   freq_error,
   next_span,
   cent_freq,
```

```
      new_start,
      curr_span: longreal;
      st_was_coupled: boolean;
      will_need_to_limit_rb: boolean;
      old_edge_state: boolean;

BEGIN
   old_edge_state := edge_can_be_peak;
   edge_can_be_peak := TRUE;
   IF new_span < 1L0 THEN new_span:= 0L0;
   { abort_execute:= false; THIS CAUSED A KEYBOARD LOCKUP.
      DAS 8/5/86 }
   WITH state DO BEGIN { If marker track is off, set up cent_freq correctly, }
      { otherwise, do the auto zoom routine.                }
      IF (signal_marker = 0) THEN
         cent_freq:= start_freq + half*span
      ELSE
         BEGIN
            { First get the marker frequency. }
            cent_freq:= markers[ signal_marker ].marker_horz;

{ Now set up for faster sweeps. }
            freq_error:= (0.05L0 - 0.17L0 * shape_factor);
            IF freq_error < 0.002L0 THEN freq_error:=
               0.002L0;
            next_span:= step_down_log(span, step_table_125);
            next_span:= step_down_log(next_span,
               step_table_125);
            IF next_span < 1L0 THEN next_span:= 0L0;
            next_span:= max( next_span, new_span );
            st_was_coupled:= swp_time_auto;
            will_need_to_limit_rb := limit_resbw_zoom;
            WHILE (next_span > new_span) AND ( NOT
               abort_execute ) DO BEGIN
                  begin_update_sequence;
                  set_start_freq( cent_freq - half*next_
                     span );
                  set_span( next_span );
                  do_sweep_coupling;
                  IF will_need_to_limit_rb THEN
                     IF res_bw < resbw_zoom THEN BEGIN
                        set_resbw (resbw_zoom);   {uncouples
                                                   res_bw}
                        will_need_to_limit_rb := FALSE;
                     END;
                  IF st_was_coupled THEN BEGIN
                     set_sweep_time( best_sweep_time(freq_error,
                                    1L0, 0.6L0) );
                  END;
                  end_update_sequence;
```

```
            show_freq_parm;
            take_sweep;
            cent_freq:= start_freq + half*span;
            next_span:= step_down_log(span,
                                      step_table_125);
            next_span:= step_down_log(next_span,
                                      step_table_125);
            IF limit_resbw_zoom THEN
               IF span <= 2.0L0 * res_bw THEN
                  next_span := 0L0;
               IF next_span < 1L0 THEN next_span:= 0L0;
               next_span:= max( next_span, new_span );
            END;

{ Now couple the sweeptime back. }
            sweep_time_coupling(st_was_coupled);
         END;

{ Now tune to the desired span }
         begin_update_sequence;
         set_start_freq( cent_freq - new_span*half );
         set_span( new_span );
         end_update_sequence;
         show_freq_parm;
      END ; { WITH state }
      edge_can_be_peak := old_edge_state;
   END;

$ GLOBPROC ON $
{---------------------------------------------------------------}

PROCEDURE exe_sp( VAR source : command_source_type ;
                      function : execrtn_function ;
                  VAR value : longreal ) ;

BEGIN
   WITH state DO BEGIN set_frq_ann_mode( cf_span ) ;

IF function = func_set THEN BEGIN
         setting_lo:= false;

step_into_zero( source, value,
                         smallest_span, smallest_span,
                         false ) ;

IF value <> span THEN BEGIN
            zoom_span( value );

need_curr_val (ann_freq2);
```

```
          END;

END ;

value := span ;

END ;
    END ;

$ GLOBPROC ON $
{------------------------------------------------------------}

PROCEDURE exe_zoomrb( VAR source : command_source_type ;
                          function : execrtn_function ;
                          VAR value : longreal )  ;
VAR
   zero : longreal;
   on   : boolean;
   out_of_range : boolean;
   temp : longreal;
   int_temp : integer;
BEGIN
   WITH state DO BEGIN
      IF function = func_set THEN BEGIN
         resbw_zoom := value;
         on := TRUE;
         IF NOT res_bw_auto THEN          { rb in manual }
            set_resbw (resbw_zoom);
         IF active_marker = 0 THEN
            exe_mkpk (source, func_default, int_temp);
         IF signal_marker = 0 THEN
            exe_mktrack ( source, func_onoff, on);
         IF on THEN take_sweep;
      END;
      IF on THEN_ BEGIN
         set_frq_ann_mode( cf_span ) ;
         limit_resbw_zoom := TRUE;
         zero := 0.0L0;
         { step_into_zero( source, zero,
                           smallest_span, smallest_span,
                           false ) ; }
         IF disp_act_cmd = cmd_zoomrb THEN
            need_active_value (2);
         zoom_span( zero );
         limit_resbw_zoom := FALSE;
         resbw_zoom := res_bw;
         IF disp_act_cmd = cmd_zoomrb THEN
            need_active_value (2);
         need_curr_val (ann_freq2);
      END ;
   END;
```

```
      value := resbw_zoom ;
   END ;
END ;

$ GLOBPROC ON $
  {------------------------------------------------------------------}
  {     FA - execute start frequency command     }

PROCEDURE exe_fa (VAR source:command_source_type;
                         function: execrtn_function;
                      VAR value:longreal);
  VAR
     temp_freq : longreal;

BEGIN
     WITH state DO BEGIN
        set_frq_ann_mode(start_stop) ;
        IF function = func_set THEN  BEGIN
           setting_lo:=false;
           IF start_freq <> value - frq_offset THEN BEGIN
              temp_freq := start_freq + span;
              begin_update_sequence ;
           (*    otical_mode THEN
                 set_start_freq( value - frq_offset,
                    min_start))
              ELSE
           *) set_start_freq( value - frq_offset);
              set_span( temp_freq - start_freq ) ;
              end_update_sequence ;
          -   need_curr_val (ann_freq1);
              END ;
           END;
           value:= start_freq + frq_offset ;
           END ;
     END ;

$ GLOBPROC OFF $
  {------------------------------------------------------------------}
  {    set stop frequency    }

PROCEDURE set_stop_freq( new_stop_freq : longreal ) ;
  BEGIN
     WITH state DO BEGIN
        begin_update_sequence;
        IF start_freq > new_stop_freq THEN BEGIN
           set_start_freq( new_stop_freq ) ;
           show_freq_parm ;
           END ;
        set_span( new_stop_freq - start_freq ) ;
        end_update_sequence;
```

```
        END ;
    END ;

$ GLOBPROC ON $
{------------------------------------------------------------------}
{      FB - execute stop frequency command         }

PROCEDURE exe_fb (VAR source:command_source_type;
                      function: execrtn_function;
                  VAR value:longreal);

BEGIN
    WITH state DO BEGIN
        set_frq_ann_mode( start_stop ) ;
        IF function = func_set THEN BEGIN
           setting_lo:= false;
           IF value <> start_freq + span + frq_offset THEN
              BEGIN
              set_stop_freq( value - frq_offset ) ;
              need_curr_val (ann_freq2);
           END;
        END;
        value:= start_freq + span + frq_offset ;
        END ;
    END ;

$ GLOBPROC ON $
{------------------------------------------------------------------}
{      LOSTART - execute lo start frequency command     }

PROCEDURE exe_lostart (VAR source:command_source_type;
                           function: execrtn_function;
                       VAR value:longreal);
VAR
   temp_start,
   temp_stop : longreal ;

BEGIN
    WITH state DO BEGIN
        IF function = func_set THEN_ BEGIN
           user_set_lo:= true;
           setting_lo:= true;
           IF value <> md_rf_to_lo (start_freq) THEN BEGIN
              begin_update_sequence ;
              temp_start:= md_lo_to_rf(value);
              temp_stop:= start_freq + span ;
              set_start_freq( temp_start );
              set_span( temp_stop - temp_start );
              end_update_sequence;
              show_freq_parm ;
           END ;
```

```
            setting_lo:= false;
            immediate_so_update ;
         END;
         value:= md_rf_to_lo( start_freq );
         END ;
   END ;

$ GLOBPROC ON $
{------------------------------------------------------------}
{    LOSTOP - execute lo stop frequency command      }

PROCEDURE exe_lostop (VAR source:command_source_type;
                         function: execrtn_function;
                     VAR value:longreal);

BEGIN
   WITH state DO BEGIN
      IF function = func_set THEN BEGIN
         user_set_lo:= true;
         setting_lo:= true;
          IF value <> md_rf_to_lo (start_freq + span) THEN
            BEGIN
            set_stop_freq( md_lo_to_rf(value) ) ;
            show_freq_parm ;
         END ;
         setting_lo:= false;
         immediate_so_update ;
      END ;
      value:= md_rf_to_lo( start_freq + span );
   END ;
END ;

$ GLOBPROC ON $
{------------------------------------------------------------}
{    FS - execute full span command    }

PROCEDURE exe_fs( VAR source : command_source_type ;
                     function : execrtn_function ) ;
VAR
   fs_start,
   fs_span: freq_type;

BEGIN
   begin_update_sequence ;
   md_full_span_values( fs_start, fs_span, state.rf_input );
   WITH state DO BEGIN
      IF (start_freq <> fs_start) OR (span <> fs_span) THEN
         BEGIN
         set_start_freq( fs_start ) ;
         set_span( fs_span ) ;
      END;
   END;
```

```
        end_update_sequence ;
        IF state.frq_ann_mode <> cf_span THEN
            set_frq_ann_mode ( cf_span )
        ELSE
            show_freq_parm ;
        END ;

$ GLOBPROC ON $
{--------------------------------------------------------------------}
{       Set start and stop frequencies           }

PROCEDURE set_start_stop( new_start, new_stop : freq_type ) ;
BEGIN
    new_stop := max( new_stop, new_start ) ;
    WITH state DO BEGIN
        begin_update_sequence ;
        set_start_freq( new_start ) ;
        set_span( new_stop - new_start ) ;
        end_update_sequence ;
        show_freq_parm ;
        END ;
    END ;

$ GLOBPROC ON $
{--------------------------------------------------------------------}
{       Set center frequency step size           }

PROCEDURE set_cf_step( new_cf_step : freq_type ) ;
BEGIN
    state.cf_step := new_cf_step ;
    END ;

{--------------------------------------------------------------------}
$GLOBPROC ON$
{*****************************************************************}
{*********************** get_extif *********************}
{*****************************************************************}
FUNCTION get_extif: BOOLEAN;
BEGIN
   get_extif := state.extif;
END;

$GLOBPROC OFF$
{*****************************************************************}
{*********************** set_extif *********************}
{*****************************************************************}
PROCEDURE set_extif(ENABLE: boolean);
   BEGIN
      { changing EXTIF is different from most hardware changes.
```

```
           Usually the execute routines call an md_xxx routine,
           which sets a local director state variable, which
           causes search_path to do the right thing.  Since the
           analyzer has to operate whether EXTIF is on or off, we
           don't let the director know what's going on.  In the
           driver that updates a br_fb, a check is made if extif
           is on, and the proper br_fb is programmed independent
           of what the current map says.  That's why we must set
           force_new_path true before calling md_recompute_bands.}

{ Don't do anything if it's not changing }
    IF ENABLE <> state.extif THEN BEGIN
        IF ENABLE AND NOT md_extif_available THEN BEGIN
            add_cntl_error(er_no_hardware);
            ENABLE:= false;
        END;
        state.extif:= ENABLE ;
        begin_update_sequence;
        force_new_path:= true;
        md_recompute_bands;
        end_update_sequence;
    END;

{ If we mistakenly didn't do anything above, this message
      will still be displayed.  }
    IF ENABLE THEN
        write_message (110, TRUE, "");{ Internal IF disabled. }
  END;

$GLOBPROC ON$
{***********************************************************}
{************************* extif ***************************}
{***********************************************************}
PROCEDURE exe_extif(VAR source: command_source_type;
                        function: execrtn_function;
                        VAR value: boolean);
BEGIN
    IF function = func_onoff THEN
        IF value <> state.extif THEN
            set_extif(value);
    value:= state.extif;
    END {of exec_extif};

$GLOBPROC ON$
{***********************************************************}
{********************** get_flimit *************************}
{***********************************************************}
FUNCTION get_flimit: BOOLEAN;
BEGIN
    get_flimit := state.flimit;
END;
```

```
$GLOBPROC OFF$
{***********************************************************}
{*********************** set_flimit ************************}
{***********************************************************}
PROCEDURE set_flimit(ENABLE: boolean);
   BEGIN
      IF ENABLE <> state.flimit THEN BEGIN
         begin_update_sequence;
         state.flimit := ENABLE;
         md_recompute_bands;
         end_update_sequence;
      END;
   END;

$GLOBPROC ON$
{***********************************************************}
{************************ flimit ***************************}
{***********************************************************}
PROCEDURE exe_flimit(VAR source: command_source_type;
                        function: execrtn_function;
                        VAR value: boolean);
BEGIN
   IF function = func_onoff THEN
      IF value <> state.flimit THEN
         set_flimit(value);
      value:= state.flimit;
   END {of exec_flimit};

$GLOBPROC ON$
{***********************************************************}
{************************* eblob ***************************}
{***********************************************************}
PROCEDURE exe_eblob(VAR source: command_source_type;
                       function: execrtn_function;
                       VAR value: boolean);
BEGIN
   IF function = func_onoff THEN BEGIN
      IF value THEN BEGIN
         dont_stop_blob := true;    { if blob already going,
                                      keep it going }
         set_flag (start_blob);
      END ELSE
         stop_blob := TRUE;
   END;
   value:= blob_on;
END {of exec_flimit};

$GLOBPROC ON$

PROCEDURE couple_panning;
BEGIN
```

```
   WITH state DO
      panning := panning_request AND (traces[0].hold =
                                          trace_write);
   set_act_kbd_function (disp_act_cmd);
END;

PROCEDURE set_panning (to_value: boolean);
BEGIN
   state.panning_request := to_value;
   couple_panning;
END;

{*********************************************************}
{********************** pan on/off ***********************}
{*********************************************************}
PROCEDURE exe_pan (VAR source: command_source_type;
                       function: execrtn_function;
                   VAR value: boolean);
BEGIN
    IF function = func_onoff THEN
         set_panning (value);
    value:= state.panning_request;
END {of exe_pan};
```

The traces are rescaled as follows:

$$relative\_start = \frac{new\_start - start\_freq}{span}$$

$$relative\_span = \frac{new\_span}{span}$$

where new_start and new_span are new settings; and start_freq and span are the last measurement start frequency and span, respectively.

length = uval - tval where uval is the last scale times two; and
    tval is the last scale times one.

offset = length * relative_start

<u>New Scale for Graphic Display (GEM):</u> new_tval = tval + offset new_uval = tval + offset + (length * rel_span)

<u>Required Clipping for Stretch:</u> if (relative_start > 0)

clip_left := offset if (rel_sum < 1.0)

clip_right := length * (1 - rel_sum)

where rel_sum := rel_start + rel_span

The trace process handles sending trace data to the display as it is being processed. This is written primarily in Motorola 68000 Assembly Language due to the high speed desired in processing an enormous quantity of data on a continuous basis. This code is rather complex and most of it has nothing to do with trace panning. The following list describes the area which installing trace panning affected in the HP71000A Modular Spectrum Analyzer firmware:

```
func_disp              ; assembly routine to display a
                       ; point
TST.B  trace_disp_on   ; IF trace_disp_on THEN
```

```
                        ; handle threshold level
                        ; handle clipping
                        ; see if okay to transmit to the
                        ; display, if not, suspend
                        ; awhile
    MOVE.B    D5,mtm_TDR1   ; send data word to display
    MOVE.B    D4,mtm_TDR2
    TST.B     pan_pen_up    ; Did we just pan and have the
                            ; pen up for that last point we
                            ; sent?
    BEQ       fdtl_end      ; If not, then done
                            ; Need to call Pascal, so save
                            ; all trace process registers.
    MOVEM.L   D0-D2/A0-A4,trace_reg ; We need to put the
                                    ; pen down.
    MOVE.L    D3,-[A7]
    JSR       pan_put_pen_down ; A Pascal subroutine to
                               ; instruct the display to put
                               ; the pen down and clear the
                               ; pan_pen_up global.
    MOVE.L    [A7]+,D3      ; restore the trace process
                            ; regs.
    MOVEM.L   trace_reg,D0-D2/A0-A4
    fdtl_end                ; end of assembly routine
```

When the pen is to be set down, the routine which detected this fact calls the subroutine pan_put_pen_down. This subroutine is coded in Pascal as:

1. PROCEDURE pan_put_pen_down;
2. VAR
3.     was_cur_disp_trace: integer;
4.     cmd: string;
5. BEGIN
   {At the moment this is called, the trace processor
   has access to the display, we are going to have to release this access to get our command out in a buffered mode (vs the polled output mode used for fast trace output). So we save the current trace number.}

Figure 10A:
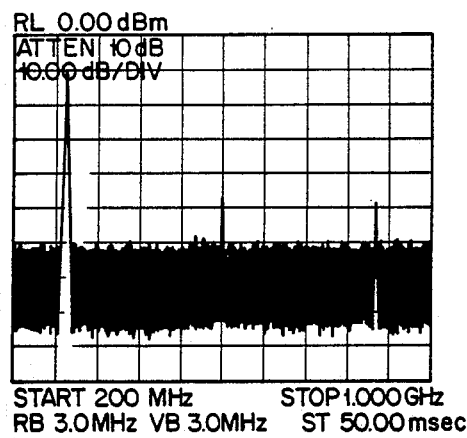

6.        was_cur_disp_trace := cur_disp_trace;
{Make sure the trace has the display (should always be).}
7.        IF trace_has_display THEN BEGIN
{Turn off polled output mode, turn on buffered mode.}
8.          release_polled_output (display_path);
{Send an end of data message so display knows no more trace data is on its way.}
9.          display_end;
{Form the command to get the pen back down and tell the display that trace data will follow again.}
10.         cmd := 'PD;GA#I';
{Send this command to the display in buffered mode.}
11.         out_disp_string (status_path, cmd);
{Update our global so we don't do this again until the trace is panned again.}
12.         pan_pen_up := false;
{Release access to the display so that polled mode can be returned to.}
13.         release_resource (gem);
{Indicate that the trace doesn't yet have permission to be output to the display.}
14.         trace_has_display := false;
15.       END;
{Acquire permission to send the same trace in polled mode. This will put things back where they were at the begin.}
16.       acquire_trace_display (was_cur_disp_trace);
17.    END;

Fig. 10 illustrates three examples, showing how the display screen appears at critical times during FIG. 10 illustrates three examples, showing how the display screen appears at critical times during adjustments and measurements. FIG. 10A in the top left hand corner shows a display for the analyzer based on an arbitrary original setting for each of the three examples. The middle column shows the intermediate estimates which are performed very quickly as the user adjusts the control settings. FIG. 10B shows an estimate based on adjustment of the center frequency to a higher center frequency. FIG. 10D shows an estimate based on adjustment of the frequency span to a broader frequency range. FIG. 10F shows an estimate based on adjustment of the stop frequency. Note that in the traditional measurement method, these estimates do not occur, and the display screen is left showing the original setting until a new measurement has been performed. FIGS. 10C, 10E, and 10G in the right hand column show the results of the final measurements following the adjustments which produced the estimates shown in FIGS. 10B, 10D, and 10F, respectively.

Again taking a look at the examples illustrated in FIG. 10, the rows of images show the results of three different adjustments that can be made by the user. The top row (FIGS. 10A, 10B, and 10C) shows the user changing the center frequency. The estimate shown in FIG. 10B is calculated by panning the old image in the appropriate direction the appropriate distance. The gap on the right hand side in FIG. 10B is due to the lack of data from the previous measurement.

The second row (FIGS. 10A, 10D, and 10E) shows the user setting a wider frequency span. In this case, the estimate shown in FIG. 10D is calculated by reducing the image horizontally. Again the gaps are caused by the lack of data from the previous measurement.

Finally, the last row (FIGS. 10A, 10F, and 10G) shows the user setting a lower right hand side frequency, the stop frequency. The estimate shown in FIG. 10F is calculated by expanding the image. The wide spacing between the points is again due to the lack of data from the previous measurement.

Accordingly, while making measurement adjustments, the user is presented with an approximation of how the new measurement results will look. This is accomplished quickly enough to give the user immediate and reliable feedback on the adjustments. This aids user adjustments of test instrument control settings.

The foregoing description is offered primarily for purposes of illustration. While a variety of embodiments has been disclosed, various modifications are contemplated. For example, although the foregoing description discloses a test instrument which measures RF and microwave signals, the principles of the invention also apply to test instruments which operate in the optical frequency range and measure light waves. Furthermore, while the foregoing description discloses a spectrum analyzer, the principles of the invention also apply generally to test instruments, including oscilloscopes and network analyzers. Additionally, while examples of approximations of panning the trace left and right while changing the x-axis center frequency; stretching or compressing the trace (spanning) while changing the frequency span; or using a combination for adjustments to only the start or stop frequency have been described, estimates can be provided based on other adjustments available to the user.

Not only can adjustments be made with knob turns or button actuations, but by any means for measurement adjustments. It will be readily apparent to those skilled in the art that numerous other modifications and variations not mentioned above can still be made without departing from the spirit and scope of the invention as claimed below.

What is claimed is:

1. A swept-tuned test instrument incorporating adjustment of control settings and display of revised trace data in light of the adjustments as a precursor to future measurements, comprising:
   an input for receiving an incoming signal;
   a swept local oscillator for producing a local oscillator signal;
   a frequency mixer connected to the input and to the local oscillator for mixing the incoming signal with the local oscillator signal;
   an IF filter connected to the mixer for passing a mixing product when the frequency of the mixing product equals a predetermined IF;
   a peak detector connected to the filter to detect the passed signal;
   a digitizer connected to the peak detector for sampling and storing the detected signal to form trace data;
   a display device connected to the digitizer and responsive to the trace data to cause a vertical deflection on the display device;
   a measure control circuit connected to the local oscillator and the display device for driving the horizontal deflection of the display device and tuning the local oscillator; and
   means connected to the measure control circuit for adjusting a control setting for measurement of the incoming signal;
   said measure control circuit being responsive to adjustment of the control setting and the stored trace data for displaying an approximation of a future measurement.

2. The test instrument of claim 1, further comprising an amplifier connected to between the digitizer and the display device for amplifying the trace data to cause a vertical deflection on the display device.

3. The test instrument of claim 1 wherein the display device is a CRT display.

4. The test instrument of claim 2 wherein the display device is a CRT display.

5. The test instrument of claim 1 wherein the means for adjusting a control setting is a knob which can be turned by a user.

6. The test instrument of claim 1 wherein the means for adjusting a control setting is a button which can be depressed by a user.

7. The test instrument of claim 1 wherein the means for adjusting a control setting is an interface for remotely adjusting the control settings.

8. A method for facilitating adjustment of control settings of a test instrument by displaying a quick estimate before performing a time consuming measurement, comprising the steps of:
   determining whether or not a user is adjusting control settings;
   calculating an estimate of how measured data might appear based on the new control settings and previously measured data if the user adjusts a control setting; and
   displaying the estimate on a display device.

9. The method of claim 8, further comprising the steps of:
   performing a new measurement after the estimate is displayed or if no adjustment is made by the user; and displaying the newly measured data on the display device with the display updated to incorporate any adjustments in the control settings;

thereby displaying an estimate only after the user commits to having a new measurement performed.

10. The method of claim 8 wherein the user adjusts a center frequency control setting to cause panning of the trace left and right while changing the x-axis center frequency.

11. The method of claim 8 wherein the user adjusts a frequency span control setting to cause stretching or compressing the trace while changing the frequency span.

12. The method of claim 8 wherein the user adjusts start and stop frequency control settings using a combination for adjustments to the start or stop frequency.

13. The method of claim 10 wherein adjusting the center frequency control setting comprises the steps of:
(1) if the new requested center frequency is already being displayed somewhere on the display device, in other words, is within the current frequency span, proceeding with trace panning since some old measured data, namely, the last trace, is available to estimate the appearance of the future measurement;
(2) calculating how much to reposition the image horizontally by calculating:

$$\frac{current\_center\_freq - new\_center\_freq}{frequency\_span}$$

to yield the fraction of the display screen to move;
(3) multiplying the above fraction by a constant (numbuckets) related to the number of available display points to translate the change into screen coordinates; and
(4) displaying the old image offset by the above result.

14. A method for facilitating adjustment of control settings of a test instrument by displaying a quick estimate before performing a time consuming measurement, comprising the steps of:
determining whether or not a user is adjusting control settings;
calculating an estimate of how measured data might appear based on the new control settings and previously measured data if the user adjusts a control setting;
checking whether or not the adjustment produces an estimate within a predetermined range of previously measured data; and
displaying the estimate on a display device if the estimate is not limited by previously measured data;
thereby continuously displaying an estimate while the user is making adjustments and before the user has committed to performing a new measurement.

15. The method of claim 14, further comprising the steps of:
performing a new measurement if no adjustment is made or if the estimate is not limited by previously measured data.

16. The method of claim 15, further comprising the steps of:
performing a new measurement if the estimate exceeds limits; and
displaying the newly measured data on the display device with the display updated to incorporate any adjustments in the control settings;
thereby holding up the measurement until either the user has stopped changing parameters or an acceptable estimate cannot be accomplished from the last measured data.

17. The method of claim 14 wherein the user adjusts a center frequency control setting to cause panning of the trace left and right while changing the x-axis center frequency.

18. The method of claim 14 wherein the user adjusts a frequency span control setting to cause stretching or compressing the trace while changing the frequency span.

19. The method of claim 14 wherein the user adjusts start and stop frequency control settings using a combination for adjustments to the start or stop frequency.

20. The method of claim 17 wherein adjusting the center frequency control setting comprises the steps of:
(1) if the new requested center frequency is already being displayed somewhere on the display device, in other words, is within the current frequency span, proceeding with trace panning since some old measured data, namely, the last trace, is available to estimate the appearance of the future measurement;
(2) calculating how much to reposition the image horizontally by calculating:

$$\frac{current\_center\_freq - new\_center\_freq}{frequency\_span}$$

to yield the fraction of the display screen to move;
(3) multiplying the above fraction by a constant (numbuckets) related to the number of available display points to translate the change into screen coordinates; and
(4) displaying the old image offset by the above result.

* * * * *